US012754478B2

(12) United States Patent
Sanders et al.

(10) Patent No.: US 12,754,478 B2
(45) **Date of Patent: *Oct. 6, 2026**

(54) PHOTOHARDENABLE COMPOSITIONS AND METHODS OF FORMING AN OBJECT

(71) Applicant: QUADRATIC 3D, INC., Charlestown, MA (US)

(72) Inventors: Samuel N. Sanders, Arlington, MA (US); Emily M. Arndt, Arkon, OH (US); Elango Kumarasamy, Arlington, MA (US); Gavin R. Kiel, Cambridge, MA (US)

(73) Assignee: QUADRATIC 3D, INC., Charlestown, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/281,215

(22) Filed: Jul. 25, 2025

(65) Prior Publication Data

US 2025/0355353 A1 Nov. 20, 2025

Related U.S. Application Data

(63) Continuation of application No. 18/945,050, filed on Nov. 12, 2024, which is a continuation of application No. PCT/US2023/022171, filed on May 13, 2023.

(60) Provisional application No. 63/438,280, filed on Jan. 11, 2023, provisional application No. 63/341,594, filed on May 13, 2022.

(51) Int. Cl.
*G03F 7/038* (2006.01)
*C08F 2/50* (2006.01)
*G03F 7/00* (2006.01)
*G03F 7/20* (2006.01)

(52) U.S. Cl.
CPC ............ *G03F 7/038* (2013.01); *G03F 7/2041* (2013.01); *G03F 7/70208* (2013.01); *G03F 7/70575* (2013.01)

(58) Field of Classification Search
None
See application file for complete search history.

(56) References Cited

U.S. PATENT DOCUMENTS

| | | | |
|---|---|---|---|
| 4,041,476 A | 8/1977 | Swainson | |
| 5,134,569 A | 7/1992 | Masters | |
| 5,230,986 A | 7/1993 | Neckers | |
| 5,474,719 A | 12/1995 | Fan et al. | |
| 5,569,431 A | 10/1996 | Hull | |
| 5,677,107 A | 10/1997 | Neckers | |
| 5,849,459 A | 12/1998 | Hagiwara et al. | |
| 6,548,593 B2 | 4/2003 | Merz et al. | |
| 8,071,666 B2 | 12/2011 | Barthel et al. | |
| 9,376,602 B2 | 6/2016 | Walther et al. | |
| 9,645,495 B2 * | 5/2017 | deVilliers | G03F 7/2022 |
| 10,208,220 B2 | 2/2019 | Shields et al. | |
| 10,392,523 B2 | 8/2019 | Shields et al. | |
| 10,843,410 B2 | 11/2020 | Lippert et al. | |
| 10,967,578 B2 | 4/2021 | Clark | |
| 11,407,890 B2 | 8/2022 | Gover et al. | |
| 11,491,711 B2 | 11/2022 | Holt et al. | |
| 11,524,457 B2 * | 12/2022 | Steege | B33Y 50/02 |
| 11,646,397 B2 * | 5/2023 | Luo | H01L 25/0753 257/79 |
| 11,908,979 B2 * | 2/2024 | Luo | H10H 29/142 |
| 11,993,005 B1 * | 5/2024 | Garmshausen | B33Y 10/00 |
| 12,179,419 B2 * | 12/2024 | Garmshausen | C08F 122/1006 |
| 12,283,647 B2 * | 4/2025 | Luo | C08F 2/48 |
| 2003/0083753 A1 * | 5/2003 | Kalgutkar | G03F 7/00 700/1 |
| 2004/0135292 A1 | 7/2004 | Coats et al. | |
| 2006/0079653 A1 | 4/2006 | Dunaev et al. | |
| 2006/0111461 A1 | 5/2006 | Barachevsky et al. | |
| 2007/0082964 A1 | 4/2007 | Weine Ramsey | |

(Continued)

FOREIGN PATENT DOCUMENTS

| | | | |
|---|---|---|---|
| DE | 10 2019 129868 A1 | 5/2021 | |
| KR | 102896632 B1 * | 12/2025 | H10H 29/142 |

(Continued)

OTHER PUBLICATIONS

Extended European Search Report dated Sep. 19, 2025 issued for European Patent Application No. 23 80 4379 which is a European Counterpart of the present application.
Bao, Y., "Recent Trends in Advanced Photoinitiators for Vat Photopolymerization 3D printing", Macromol. Rapid Commun. 2022, 43, 2200202.
Hahn, V., et al., "Light-sheet 3D microprinting via two-colour two-step absorption", Nature Photonics, vol. 16, Nov. 2022, 784-791 (published online Oct. 13, 2022).
Ichimura, K., et al., „A Spiropyran-Iodonium Salt System as a Two Photon Radical Photoinitiator, J Polym. Sci: Part C: Polymer Letters, vol. 26, 185-189 (1988).

(Continued)

*Primary Examiner* — Sanza L. McClendon

(57) ABSTRACT

The present invention relates to photohardenable compositions and methods of forming an object, the method preferably including a photohardenable composition described herein. Preferred photohardenable compositions and methods include a photohardenable resin component, a first photoinitiator that is activatable by exposure to light at a first wavelength and light at a second wavelength, and a second photoinitiator that is activatable by exposure to light at a third wavelength, wherein the first, second, and third wavelengths are not the same, and the third wavelength is shorter than the first wavelength and the second wavelength. Preferred first photoinitators include photoswitchable photoinitiators. Preferably the second light-activated photoinitiator comprises a free-radical photoinitiator. Hardenable resin compositions and methods of forming an object including the hardenable resin composition are also disclosed.

25 Claims, No Drawings

(56) References Cited

U.S. PATENT DOCUMENTS

| | | | |
|---|---|---|---|
| 2007/0108644 A1 | 5/2007 | Cregger | |
| 2007/0211110 A1 | 9/2007 | Iftime et al. | |
| 2009/0202919 A1 | 8/2009 | Waldman et al. | |
| 2013/0116358 A1 | 5/2013 | Rrahimi | |
| 2015/0111979 A1 | 4/2015 | Yang et al. | |
| 2015/0202805 A1 | 7/2015 | Saruhashi | |
| 2015/0234270 A1 | 8/2015 | Doyle et al. | |
| 2016/0067922 A1 | 3/2016 | Voris et al. | |
| 2016/0137838 A1 | 5/2016 | Roland et al. | |
| 2016/0271875 A1 | 9/2016 | Brown, Jr. | |
| 2017/0022311 A1 | 1/2017 | Liu et al. | |
| 2017/0291356 A1 | 10/2017 | Adachi et al. | |
| 2018/0015672 A1 | 1/2018 | Shusteff et al. | |
| 2018/0257297 A1 | 9/2018 | Matheu | |
| 2018/0326666 A1 | 11/2018 | Kelly et al. | |
| 2018/0333913 A1 | 11/2018 | Lin et al. | |
| 2019/0193204 A1 | 6/2019 | Houbertz et al. | |
| 2019/0358895 A1 | 11/2019 | Jau et al. | |
| 2020/0039118 A1 | 2/2020 | Panzer et al. | |
| 2020/0063093 A1 | 2/2020 | Matheu et al. | |
| 2020/0108557 A1 | 4/2020 | Lippert et al. | |
| 2020/0338828 A1 | 10/2020 | Indyk | |
| 2020/0361152 A1 | 11/2020 | Shusteff et al. | |
| 2020/0373279 A1* | 11/2020 | Ganapathiappan | G03F 7/028 |
| 2020/0384682 A1 | 12/2020 | Loterie et al. | |
| 2021/0213675 A1 | 7/2021 | Converse et al. | |
| 2021/0291460 A1 | 9/2021 | Clark | |
| 2022/0007005 A1 | 1/2022 | Lippert et al. | |
| 2022/0025255 A1 | 1/2022 | Congreve et al. | |
| 2022/0055290 A1 | 2/2022 | Hahn et al. | |
| 2022/0299866 A1* | 9/2022 | Tsen | G03H 1/02 |
| 2022/0299938 A1* | 9/2022 | Lane | C08J 3/28 |
| 2023/0012690 A1 | 1/2023 | Arndt | |
| 2023/0094821 A1 | 3/2023 | Twietmeyer et al. | |
| 2024/0166912 A1* | 5/2024 | Sanders | C08F 2/50 |
| 2024/0198583 A1* | 6/2024 | Arndt | B29C 64/264 |
| 2024/0208111 A1* | 6/2024 | Twietmeyer | G03B 21/142 |
| 2024/0217943 A1 | 7/2024 | Sanders et al. | |
| 2024/0218086 A1* | 7/2024 | Sanders | B33Y 10/00 |
| 2024/0316865 A1* | 9/2024 | Twietmeyer | B29C 64/277 |
| 2025/0066584 A1 | 2/2025 | Sanders et al. | |
| 2025/0066585 A1* | 2/2025 | Sanders | C09D 11/101 |
| 2025/0066615 A1* | 2/2025 | Kiel | B33Y 70/00 |
| 2025/0068071 A1* | 2/2025 | Sanders | G03F 7/095 |
| 2025/0346776 A1* | 11/2025 | Sanders | B33Y 10/00 |

FOREIGN PATENT DOCUMENTS

| | | | |
|---|---|---|---|
| WO | WO-2006034474 A2 * | 3/2006 | A61P 35/00 |
| WO | WO 2010/107784 A1 | 9/2010 | |
| WO | WO 2016/048361 A1 | 3/2016 | |
| WO | WO 2019/194798 A1 | 10/2019 | |
| WO | WO 2020/139858 A1 | 7/2020 | |
| WO | WO-2020203321 A1 * | 10/2020 | B28B 13/029 |
| WO | WO 2020/245456 A1 | 12/2020 | |
| WO | WO-2020242850 A1 * | 12/2020 | H10H 20/822 |
| WO | WO 2021/089090 A1 | 5/2021 | |
| WO | WO 2021/154895 A1 | 8/2021 | |
| WO | WO 2021/154897 A1 | 8/2021 | |
| WO | WO 2021/247926 A1 | 12/2021 | |
| WO | WO 2023/009204 A1 | 2/2023 | |
| WO | WO 2023/034398 A1 | 3/2023 | |

OTHER PUBLICATIONS

International Search Report, Written Opinion, Search History and Notification of Transmittal mailed Aug. 21, 2023 in grandparent International Application No. PCT/US2023/022171 filed May 13, 2023.

Jiang, Z., et al., "Extrusion 3D Printing of Polymeric Materials with Advanced Properties", Adv. Sci. 2020, 7, 2001379 (32 pages).

Konuray, O., et al., "Dual-curable stereolithography resins for superior thermomechanica; properties", eXPRESS Polymer Letters vol. 14 No. 9 (2020) 881-894.

Lara, L., et al. "Effect of combining photoinitiators on cure efficiency of dental resin-based composites", J. Appl. Oral Sci., 2021: 29: e20200467.

Lee, S-K., et al., "Benzospiropyrans as Photochromic and/or Thermochromic Photoinitiators", Chem. Mater. 1991, 3, pp. 852-858.

Lee, S-K., et al., "Two-photon radical photoinitiator system based on iodinated benzospiropyrans", Chem. Mater. 1991, 3, pp. 858-864.

Lee, Y-H, et al., "Fabrication of Periodic 3D Nanostructuration for Optical Surfaces by Holographic Two-Photon-Polymerization", Int'l Journal of Information and Electronics Engineering, vol. 6, No. 3, May 2016.

Liravi, F., et al., "Additive manufacturing of 3D structures with non-Newtonian highly viscous fluids: Finite element modeling and experimental validation", Additive Manufacturing (2016), http://dx.doi.org/10.1016/j.addma.2016.10.008.

Lu, P., et al., "Wavelength-selective light-matter interactions in polymer science", Matter 4, 2172-2229, Jul. 7, 2021.

Reghely, M., et al., "Xolography for linear volumetric 3D printing", Nature vol. 588 Dec. 24/31, 2020.

Reghely, M., et al., Supplementary Information—"Xolography for linear volumetric 3D printing", NatureResearch 2020.

Texas Instruments Application Report DLPA022—Jul. 2010 entitled "DLP™ System Optics".

Texas Instruments "TI DLR Technology for 3D Printing—Design scalable high-speed stereolithograpy [sic] systems using TI DLP technology" 2016.

Texas Instruments "DLP6500 0.65 1080p MVSP Type A DMD", DLP6500, DLPS040A—Oct. 2014—Revised Oct. 2016.

Towns, Andrew D., Chapter 5 entitled "Industrial Photochromism" (pp. 227-279), Giacomo Bergamini, Serena Silvi (eds.), *Applied Photochemistry*, Lecture Notes in Chemistry 92, DOI 10.1007/978-3-319-31671-0_5, Publisher: Springer International Publishing Switzerland.

Wang, B., et al., Nature Communications (2022) 13:367 (https://doi.org/10.1038/s41467-022-28013-4).

Zareanshahraki, F., et al "Effect of post-curing process on the performance of automotive 3D-printed specimens", RadTech 2020, https://radtech2020.com > Papers > 3D Printing.

EPO Communication under Rule 114(2) EPC dated Mar. 23, 2026 forwarding observations by a third party concerning EP Application No. 23804379, the EP counterpart of the PCT grandparent of the present application.

EPO Evaluation of the objections raised by the third party in the third party observations submitted in EP Application No. 23804379 on 03172026.

Extract from the EP Register for EP Application No. 23804379 showing the 20260320 posting date of "Information about non-relevance of third-party observations".

Observations by a third party submitted to the European Patent Office in Apr. 16, 2026 concerning EP Application No. 23804349.8, the EP counterpart of the PCT grandparent of the present application. (Such Third Party Observations were forwarded by the EPO Applicant's European associate on Apr. 23, 2026 (see item 2 below).

EPO Communication under Rule 114(2) EPC dated Apr. 23, 2026 forwarding observations by a third party concerning EP Application No. 23804379.8, the EP counterpart of the PCT grandparent of the present application.

Observations by a third party submitted to the European Patent Office on May 7, 2026 concerning EP Application No. 26164054.4, a divisional of EP Application No. 23804349 which is the EP counterpart of the PCT grandparent of the present application.

Extended European Search Report mailed by the European Patent Office on Jul. 3, 2026 concerning EP Application No. 26164054.4 which is a divisional of EP Application No. 23804379, which is an EP counterpart of the PCT grandparent of the present application.

* cited by examiner

PHOTOHARDENABLE COMPOSITIONS AND METHODS OF FORMING AN OBJECT

CROSS-REFERENCE TO RELATED APPLICATIONS

This application is a continuation of U.S. patent application Ser. No. 18/945,050, filed Nov. 12, 2024, which is a continuation of International Application No. PCT/US2023/022171, filed May 13, 2023, which International Application claims priority to U.S. Provisional Patent Application No. 63/341,594 filed on May 13, 2022 and U.S. Provisional Patent Application No. 63/438,280 filed on Jan. 11, 2023. Each of the foregoing U.S. patent application, International Application, and U.S. Provisional Patent Applications is hereby incorporated herein by reference in its entirety for all purposes.

TECHNICAL FIELD OF THE INVENTION

The present invention relates to the technical field of three-dimensional printing and related compositions, materials, and methods.

BRIEF SUMMARY OF THE INVENTION

The present invention includes photohardenable compositions and methods for forming an object. Preferred photohardenable compositions and methods include a photohardenable resin component, a first photoinitiator that is activatable by exposure to light at a first wavelength and light at a second wavelength, and a second photoinitiator that is activatable by exposure to light at a third wavelength, wherein the first, second, and third wavelengths are not the same, and the third wavelength is shorter than the first wavelength and the second wavelength. Preferably the second photoinitiator comprises a free-radical photoinitiator. The present invention also includes hardenable resin compositions including a photohardenable resin component, a first photoinitiator that is activatable by exposure to light at a first wavelength and light at a second wavelength to induce a crosslinking or polymerization reaction in the photohardenable composition, a second photoinitiator that is activatable by exposure to light at a third wavelength, wherein the first, second, and third wavelengths are not the same and the third wavelength is shorter than the first wavelength and the second wavelength, and a resin component that is hardenable by a thermally driven reaction or mechanism, the resin component comprising a monomer, an oligomer, a prepolymer, a polymer, or a mixture including at least one the foregoing, and methods for forming an object including a hardenable resin composition described herein.

Achieving a maximum possible degree of conversion of reactive species to a polymer or cross-linked state in 3D printing is desirable for producing parts (also referred to herein as objects) with reduced leaching of reactive species and/or one or more improved physical properties, such, for example, increased hardness, flexural modulus, tensile strength, scratch resistance, tear resistance, etc.

Advantageously, inclusion of a second photoinitiator that is activatable by exposure to light at a third wavelength in a photohardenable composition including photohardenable resin component and a first photoinitiator that is activatable by exposure to light at a first wavelength and light at a second wavelength, in accordance with the present invention, can facilitate achieving a higher degree of conversion without requiring use of the first photoinitiator in amounts for achieving a sufficiently hardened object, which can disadvantageously result in attenuation of the passage of the first wavelength through the photohardenable composition due to increased absorption of first wavelength light by the higher amounts of the first photoinitiator. Such attenuation can result, for example, in non-uniform printing across the volume.

Inclusion of a second photoinitiator that is activatable by exposure to light at a third wavelength in a photohardenable resin component in addition to the first photoinitiator, and subsequent exposure of an initial print of an object formed via photoactivation of the first photoinitiator to the third wavelength for activating the second photoinitiator, can facilitate achieving a higher degree of conversion of reactive species to a polymer or cross-linked state in the printed object without increased amount of the first photoinitiator. By including a second photoinitiator with a shorter wavelength of activation than the wavelengths for activating the first photoinitiator, the printing process is not affected by the presence of the second photoinitiator and can facilitate faster and more complete post-cure of the initial print in a post-curing step including exposure to light at a third wavelength.

As used herein, "initial print" refers to an object that is not fully hardened that results from selective exposure of the photohardenable composition to the first and second wavelengths. An initial print can preferably have the same shape as, or a shape to be imparted to, the desired object being printed.

In accordance with one aspect of the present invention, there is provided a photohardenable composition comprising a photohardenable resin component, a first photoinitiator that is activatable by exposure to light at a first wavelength and light at a second wavelength to induce a crosslinking or polymerization reaction in the photohardenable composition, and a second photoinitiator that is activatable by exposure to light at a third wavelength, wherein the first, second, and third wavelengths are not the same and the third wavelength is shorter than the first wavelength and the second wavelength.

Preferably the second photoinitiator comprises a free-radical photoinitiator.

Preferably the third wavelength is shorter than the first wavelength which in turn is shorter than the second wavelength.

A second photoinitiator comprising a Type I free-radical photoinitiator can be preferred.

Preferred first photoinitiators activatable by exposure to light at a first wavelength and light at a second wavelength include photoswitchable photoinitiators. (A photoinitiator that is activatable by exposure to light at a first wavelength and light at a second wavelength may also be referred to herein as a dual-wavelength photoinitiator.)

Preferably the second photoinitiator shows no or minimal absorption of the first wavelength and the second wavelength.

It can be desirable for the second photoinitiator not to be activatable or appreciably activatable by the first or second wavelengths to avoid undesired reactions in the photohardenable composition in the absence of exposure to the third wavelength.

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object.

The third wavelength may further excite the dual-wavelength photoinitiator included in the object resulting from exposure to the first and second wavelengths to further harden the object.

In accordance with another aspect of the present invention, there is provided a photohardenable composition comprising a photohardenable resin component, a first photoinitiator that is activatable by exposure to light at a first wavelength and light at a second wavelength to induce a crosslinking or polymerization reaction in the photohardenable composition, and a second photoinitiator comprising a Type I free-radical photoinitiator that is activatable by exposure to light at a third wavelength, wherein the first, second, and third wavelengths are not the same and the third wavelength is shorter than the first wavelength and the second wavelength.

Preferably the third wavelength is shorter than the first wavelength which in turn is shorter than the second wavelength.

Preferred first photoinitiators activatable by exposure to light at a first wavelength and light at a second wavelength include photoswitchable photoinitiators.

Preferably the second photoinitiator shows no or minimal absorption of the first wavelength and the second wavelength.

It can be desirable for the second photoinitiator not to be activatable or appreciably activatable by the first or second wavelengths to avoid undesired reactions in the photohardenable composition in the absence of exposure to the third wavelength.

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object.

The third wavelength may further excite dual-wavelength photoinitiator included in the object resulting from exposure to the first and second wavelengths to further harden the object.

In accordance with another aspect of the present invention, there is provided a hardenable resin composition useful for forming an object, the hardenable resin composition comprising: a photohardenable resin component, a first photoinitiator that is activatable by exposure to light at a first wavelength and light at a second wavelength to induce a crosslinking or polymerization reaction in the photohardenable composition, a second photoinitiator that is activatable by exposure to light at a third wavelength, wherein the first, second, and third wavelengths are not the same and the third wavelength is shorter than the first wavelength and the second wavelength, and a resin component that is hardenable by a thermally driven reaction or mechanism, the resin component comprising a monomer, an oligomer, a prepolymer, a polymer, or a mixture including at least one the foregoing.

Preferably the second photoinitiator comprises a free-radical photoinitiator.

Preferably the third wavelength is shorter than the first wavelength which in turn is shorter than the second wavelength.

A second photoinitiator comprising a Type I free-radical photoinitiator can be preferred.

Preferred first photoinitiators activatable by exposure to light at a first wavelength and light at a second wavelength include photoswitchable photoinitiators.

Preferably the second photoinitiator shows no or minimal absorption of the first wavelength and the second wavelength.

It can be desirable for the second photoinitiator not to be activatable or appreciably activatable by the first or second wavelengths to avoid undesired reactions in the photohardenable composition in the absence of exposure to the third wavelength.

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object.

The third wavelength may further excite the dual-wavelength photoinitiator included in the object resulting from exposure to the first and second wavelengths to further harden the object.

It may also be desirable to include a thermally activated radical photoinitiator in a photohardenable composition and/or hardenable resin composition described herein.

In accordance with another aspect of the invention, there is provided a method of forming an object, the method comprising:

providing a volume of a photohardenable composition comprising a photohardenable resin component, a first photoinitiator that is activatable by exposure to light at a first wavelength and light at a second wavelength to induce a crosslinking or polymerization reaction in the photohardenable composition, and a second photoinitiator that is activatable by exposure to light at a third wavelength, wherein the first, second, and third wavelengths are not the same and the third wavelength is shorter than the first wavelength and the second wavelength;

selectively irradiating the photohardenable composition at a series of selected locations in the volume with light at the first wavelength and light at the second wavelength to form a partially hardened object in the volume of the photohardenable composition; and irradiating the partially hardened object with light at a third wavelength to further harden the partially hardened object.

The method can further include removing or separating the partially hardened object from the volume prior to irradiation with the light at the third wavelength.

Preferably the photohardenable composition comprises a photohardenable composition in accordance with the present invention.

In accordance with another aspect of the invention, there is provided a method of forming an object, the method comprising:

providing a volume of a photohardenable composition comprising a photohardenable resin component, a first photoinitiator that is activatable by exposure to light at a first wavelength and light at a second wavelength to induce a crosslinking or polymerization reaction in the photohardenable composition, and a second photoinitiator that is activatable by exposure to light at a third wavelength, wherein the first, second, and third wavelengths are not the same and the third wavelength is shorter than the first wavelength and the second wavelength;

irradiating the photohardenable composition at one or more selected locations with light at the first wavelength and light at the second wavelength to induce a crosslinking or polymerization reaction in the photohardenable composition in a selected configuration at the selected one or more locations to at least partially form a partially hardened object; and optionally repeating the irradiating step one or more times wherein, for a repeated step, the one or more selected locations are the same as or different from any previous one or more selected locations and the selected configuration is the same as or different from a previous selected configuration, to provide a partially hardened object;

separating or removing the partially hardened object from the volume; and irradiating the partially hardened object with light at a third wavelength to further harden the initial print.

Preferably the photohardenable composition comprises a photohardenable composition in accordance with the present invention.

In accordance with another aspect of the present invention, there is provided a method of forming an object, the method comprising:

(a) providing a volume of a hardenable resin composition, wherein hardenable resin composition comprises a photohardenable resin component, a first photoinitiator that is activatable by exposure to light at a first wavelength and light at a second wavelength to induce a crosslinking or polymerization reaction in the photohardenable composition, a second photoinitiator that is activatable by exposure to light at a third wavelength, wherein the first, second, and third wavelengths are not the same and the third wavelength is shorter than the first wavelength and the second wavelength, and a resin component that is hardenable by a thermally driven reaction or mechanism, the resin component comprising a monomer, an oligomer, a pre-polymer, a polymer, or a mixture including at least one the foregoing;

(b) forming an initial print from the hardenable resin composition, wherein formation of the initial print comprises:

(i) simultaneously or sequentially irradiating one or more selected locations within the volume of the hardenable resin composition with light having a first wavelength and light having a second wavelength, wherein light having the first wavelength and light having the second wavelength activate the photoswitchable photoinitiator at the one or more selected locations to induce a crosslinking or polymerization reaction in the photohardenable composition at the intersection of the first and second wavelengths at the one or more selected locations within the volume to at least partially form an initial print; and (ii) optionally repeating step (i) at one or more of the same or different selected locations within the volume of the hardenable resin composition until the initial print is formed; and (c) irradiating the initial print with light at a third wavelength to further harden the initial print.

The method can further include separating or removing the initial print from the volume prior to step (c).

The method can further include heating the initial print or partially hardened object before, during or after irradiation with light at the third wavelength to further harden the object.

Preferably a hardenable resin composition can include a photohardenable composition described herein and a resin component that is hardenable by a thermally driven reaction or mechanism, the resin component comprising a monomer, an oligomer, a pre-polymer, a polymer, or a mixture including at least one the foregoing.

It may be further desirable to include a thermally activated radical photoinitiator.

In the methods described herein, the second photoinitiator preferably comprises a free-radical photoinitiator.

In the methods described herein, the third wavelength is preferably shorter than the first wavelength which in turn is shorter than the second wavelength.

In the methods described herein, preferred first photoinitiators activatable by exposure to light at a first wavelength and light at a second wavelength include photoswitchable photoinitiators.

Optionally, the methods described herein can further include washing the object after removal or separation from the volume of the photohardenable composition prior to irradiation with light at the third wavelength. It can be desirable to wash the separated object prior to irradiating it with light of the third wavelength, for example, to avoid polymerization or cross-linking of any residual material adhered to the initial print during third wavelength irradiation.

In the methods described herein, a second photoinitiator comprising a Type I free-radical photoinitiator can be preferred.

In the methods described herein, the second photoinitiator preferably shows no or minimal absorption of the first wavelength and the second wavelength.

In the methods described herein, it can be desirable for the second photoinitiator not to be activatable or appreciably activatable by the first or second wavelengths to avoid undesired reactions in the photohardenable composition in the absence of exposure to the third wavelength.

In the methods described herein, exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object to further harden the partially hardened object.

In the methods described herein, the third wavelength may further excite dual-wavelength photoinitiator included in the object resulting from exposure to the first and second wavelengths to further harden the object.

In the methods described herein, it may also be desirable to include a thermally activated radical photoinitiator in a photohardenable composition and/or hardenable resin composition described herein.

The foregoing, and other aspects and embodiments described herein and contemplated by this disclosure all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed.

Other embodiments will be apparent to those skilled in the art from consideration of the description, from the claims, and from practice of the invention disclosed herein.

DETAILED DESCRIPTION OF THE INVENTION

Various aspects and embodiments of the present invention will be further described in the following detailed description.

The present invention includes photohardenable compositions and methods for forming an object, the method preferably including a photohardenable composition described herein. Preferred photohardenable compositions and methods include a photohardenable resin component, a first photoinitiator that is activatable by exposure to light at a first wavelength and light at a second wavelength, and a second photoinitiator that is activatable by exposure to light at a third wavelength, wherein the first, second, and third wavelengths are not the same, and the third wavelength is shorter than the first wavelength and the second wavelength. Preferably the second photoinitiator comprises a free-radical photoinitiator. The present invention also includes hardenable resin compositions including a photohardenable resin component, a first photoinitiator that is activatable by exposure to light at a first wavelength and light at a second wavelength to induce a crosslinking or polymerization reaction in the photohardenable composition, a second photoinitiator that is activatable by exposure to light at a third wavelength, wherein the first, second, and third wavelengths are not the same and the third wavelength is shorter than the first wavelength and the second wavelength, and a resin component that is hardenable by a thermally driven reaction or mechanism, the resin component comprising a monomer, an oligomer, a pre-polymer, a polymer, or a mixture including at least one the foregoing, and methods for forming an object including a hardenable resin composition described herein.

Achieving a maximum possible degree of conversion of reactive species to a polymer or cross-linked state in 3D printing is desirable for producing parts (also referred to herein as objects) with reduced leaching of reactive species and/or one or more improved physical properties, such, for example, increased hardness, flexural modulus, tensile strength, scratch resistance, tear resistance, etc.

In our photohardenable compositions that include a photohardenable resin component and a first photoinitiator that is activatable by exposure to light at a first wavelength and light at a second wavelength, to achieve sufficient light transmissiveness at a first wavelength (used for activating the ground state form of the dual-wavelength photoinitiator) to allow printing into the volume at depth, we preferably use very small amounts of the first photoinitiator. Such amounts can preferably be in a range from about 0.0001 to about 0.02 weight percent. Such amounts can more preferably be in amounts in the tens of parts per million, e.g., from 0.0001 to less than 0.02 weight percent, and most preferably in an amount in a range from about 0.0001 to about 0.01 weight percent, from about 0.0001 to about 0.004 weight percent, from about 0.0001 to about 0.003 weight percent, 0.0001 to about 0.0025 weight percent, from about 0.0001 to about 0.002 weight percent, from about 0.0001 to about 0.0015 weight percent, from about 0.0001 to about 0.001 weight percent, or 0.0001 to less than 0.001 weight percent. However, such amounts of a first photoinitiator comprising a dual-wavelength photoinitiator have not been found to be sufficient to achieve an object that is sufficiently cured for its intended end-use application, but instead provides a photohardenable composition or object that is partially cured and is capable of, or can undergo, further hardening.

For example, a partially hardened object that is partially, but less than fully, cured or hardened can be less than 100 percent, less than 99.9 percent, less than 99.5 percent, less than 99 percent, less than 98 percent, less than 97 percent, less than 96 percent, less than 95 percent, less than 94 percent, less than 93 percent, less than 92 percent, less than 91 percent, less than 90 percent, less than 85 percent, less than 80 percent, less than 70 percent, less than 60 percent, less than 50 percent, less than 40 percent, less than 35 percent, less than 30 percent, less than 25 percent, less than 20 percent, or less than 10 percent cured or hardened, but is preferably at least sufficiently cured or hardened for the partially hardened object to retain its shape without undergoing deformation or distortion during removal or separation from the volume in which it is formed, and more preferably, to also retain any surface features during removal or separation therefrom.

We have overcome this obstacle by including a second photoinitiator that is activatable by exposure to light at a third wavelength in a photohardenable composition including a photohardenable resin component, in addition to a first photoinitiator that is activatable by exposure to light at a first wavelength and light at a second wavelength used to produce an initial print for defining the shape of the object or shape to be imparted to the object being printed. By selecting second photoinitiators with a shorter wavelength of activation than the wavelengths for activating the first photoinitiator that is activatable by exposure to light at a first wavelength and light at a second wavelength, the printing process is not affected by the presence of the second photoinitiator. However, its presence can facilitate faster and/or more complete post-cure in a post-curing step including exposure to light at a third wavelength.

Advantageously, inclusion of a second photoinitiator in the photohardenable composition, in accordance with the present invention, and subsequent exposure of the initial print to a third wavelength for activating the second photoinitiator, can facilitate achieving a higher degree of conversion of reactive species to a polymer or cross-linked state in the printed object.

The present invention can achieve such higher degree of conversion without requiring use of higher amounts of the first photoinitiator that is activatable by exposure to light at a first wavelength and light at a second wavelength which can disadvantageously result in attenuation of the passage of the first wavelength through the volume due to increased absorption of first wavelength light by the higher amounts of the first photoinitiator. Such attenuation can result, for example, in non-uniform printing across the volume.

A photohardenable composition in accordance with the present invention is particularly well-suited for use in forming an object, including, for example, in building a three-dimensional (3D) object, such as by 3D printing, especially volumetric three-dimensional-printing, and in building a two-dimensional pattern, such as by lithography.

In accordance with one aspect of the present invention, there is provided a photohardenable composition comprising a photohardenable resin component, a first photoinitiator that is activatable by exposure to light at a first wavelength and light at a second wavelength to induce a crosslinking or polymerization reaction in the photohardenable composition, and a second photoinitiator that is activatable by exposure to light at a third wavelength, wherein the first, second, and third wavelengths are not the same, and the third wavelength is shorter than the first wavelength and the second wavelength.

Preferably the second photoinitiator comprises a free-radical photoinitiator.

Preferably the third wavelength is shorter than the first wavelength which in turn is shorter than the second wavelength.

A second photoinitiator comprising a Type I free-radical photoinitiator can be preferred.

Preferred first photoinitiators activatable by exposure to light at a first wavelength and light at a second wavelength include photoswitchable photoinitiators.

Preferably the second photoinitiator shows no or minimal absorption of the first wavelength and the second wavelength.

It can be desirable for the second photoinitiator not to be activatable or appreciably activatable by the first or second wavelengths to avoid undesired reactions in the photohardenable composition in the absence of exposure to the third wavelength.

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object.

The third wavelength may further excite dual-wavelength photoinitiator included in the object resulting from exposure to the first and second wavelengths to further harden the object.

Examples of first and second wavelength ranges at which preferred first photoinitiators comprising a photoswitchable photoinitiator for inclusion in a photohardenable composition described herein are activatable include a first wavelength in a range from about 300 nm to about 550 nm, from about 350 to about 460 nm, from about 350 to about 455 nm, from about 350 to about 445 nm, from about 350 to about 410 nm, from about 350 to about 405 nm, from about 375 to about 460 nm, from about 375 to 455 nm, from about 375 to 445 nm, from about 375 to 410 nm, from about 375 to about 405 nm, about 375 nm±10 nm, about 405 nm±10 nm, about 410+nm, and a second wavelength in a range from about 450 nm to about 1000 nm, for example, but not limited to, from about 450 nm to about 850 nm most typically, from about 450 nm to about 700 nm.

Second photoinitiators that can be desirable for use with such first photoinitiators are preferably activatable at a third wavelength less than the first wavelength and the second wavelength. A second photoinitiator is preferably selected taking into consideration the first and second wavelengths for activating the first photoinitiator. A third wavelength in a range, for example, from about 240 nm to about 455 nm, from about 240 nm to about 445 nm, from about 240 to about 400 nm, can be useful.

First photoinitiators that are activatable at first and second wavelengths in other ranges may also be suitable. In such cases, a second photoinitiator is preferably selected to be responsive to a third wavelength that is shorter than the first wavelength and the second wavelength.

A first photoinitiator and a second photoinitiator can independently comprise a single photoinitiator or a combination of photoinitiators or a photoinitiator system including two or more components, at least one of which is the first photoinitiator or the second photoinitiator.

Selection of a second photoinitiator is generally made taking into consideration the absorption band of the second photoinitiator and the wavelength of the radiation or light that will be used to activate the second photoinitiator and the first and second wavelengths for activating the photoswitchable photoinitiator so that undesired polymerization is avoided. By way of non-limiting examples, second photoinitiators are available that can be activated by UV or visible wavelength light. Other factors, e.g., absorption coefficients, rate constants of the primary radicals toward the photohardenable resin component, possible side reactions, light intensity can also be taken into consideration and balanced in the selection process. See, for example, A, Eibel, et al., "Choosing the ideal photoinitiator for free-radical photopolymerizations: predictions based on simulations using established data", Polym. Chem., 2018, 9, 5107-5115.

The second photoinitiator preferably comprises a photoinitiator that initiates polymerization or cross-linking of the photohardenable resin component by free-radical reactions (also referred to herein as a free-radical photoinitiator). A second photoinitiator can comprise a Type I photoinitiator. (A Type I photoinitiator may also be referred to in the art as a Norrish Type I photoinitiator.) A second photoinitiator can comprise a Type II photoinitiator. (A Type II photoinitiator may also be referred to in the art as a Norrish Type II photoinitiator.) A second photoinitiator comprising a single component, e.g., a Type I photoinitiator, which does not appreciably absorb light at the first or second wavelength, can be preferred.

Examples of second photoinitiators include, but are not limited to, acetophenone, anisoin, anthraquinone, benzil, benzoin, benzoin ethyl ether, benzophenone, 1-hydroxycyclohexyl phenyl ketone, 2-benzyl-2-(dimethylamino)-4'-morpholinobutyrophenone, 4,4'bis(diethylamino) benzophenone, thioxanthone, 2-chlorothioxanthone, dibenzosuberenone, 2,2'-diethoxyacetophenone, 4,4' dihydroxybenzophenone, 2,2-dimethoxy-2-phenylacetophenone, diphenyl(2,4,6 trimethylbenzoyl) phosphine oxide (TPO), 4'-ethoxyacetophenone, 3'-hydroxyacetophenone, 4'-hydroxyacetophenone, 3-hydroxybenzophenone, 1-hydrocyclohexyl phenyl ketone, 2-hydroxy-2-methylpropiophenone, methylbenzoylformate, 2-methyl-4'-(methylthio)-2-morpholinopriopiophenone, phenanthraquinone, 4'-phenoxyacetophenone.

An example of preferred second photoinitiator comprising a free-radical photoinitiator is Omnirad 184 (1-hydroxycyclohexyl-phenyl ketone) available from IGM.

Optionally the second photoinitiator can additionally or alternatively be included in the photohardenable composition as a functional group attached to a photohardenable resin component or other resin component (e.g., a monomer, polymer, a co-polymer comprising a photoinitiator monomer and one or more other monomer, etc.).

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object for further hardening of the initial print or partially hardened object.

Preferably the second photoinitiator shows no or minimal absorption of the first wavelength and the second wavelength.

It can be desirable for the second photoinitiator not to be activatable or appreciably activatable by the first or second wavelengths to avoid undesired reactions in the photohardenable composition in the absence of exposure to the third wavelength.

The third wavelength may further excite dual-wavelength photoinitiator included in the object resulting from exposure to the first and second wavelengths to further harden the object.

As mentioned above, inclusion of the second photoinitiator advantageously facilitates post-curing an object resulting from selective exposure of the photohardenable composition to the first and second wavelengths, preferably having the same shape as, or a shape to be imparted to the desired object, with a higher degree of hardness. Such inclusion can facilitate reduced amounts of time and/or power required to achieve the desired hardened object.

For example, inclusion of the second photoinitiator can be advantageous in reducing overall print time by increasing the rate of further hardening of an object that is not fully hardened resulting from selective exposure of the photohardenable composition to the first and second wavelengths in a post-curing step including exposure of such partially hardened object to third wavelength light compared to formulations without the included second photoinitiator.

Preferably the object resulting from selective exposure of the photohardenable composition to the first and second wavelengths has a hardness that is at least sufficient to provide an object having the same shape as, or a shape to be imparted to, the desired object that can retain its shape, and more preferably also retain surface features, when removed or separated from the volume in which it is formed. Such determination can be readily made by a person of ordinary skill in the relevant art without undue experimentation.

Information concerning the determination of the extent of polymerization or degree of cure of a monomer that may be useful can be found in Hafkamp, T. M., Mechatronics (2018), https://doi.org/10.1016/j.mechatronics.2018.02.006, and Macarie, L., Ilia, Gheorghe, Central European Science Journal of Chemistry (CEJC) 3 (4) 2005 721-730.

Preferably the second photoinitiator does not extend the sensitivity of the first photoinitiator such that the ground state form of the first photoinitiator becomes activated at a wavelength that is longer than the wavelength at which it would be activable in the absence of the second photoinitiator.

Post-curing of an initial print or partially hardened object can be carried out with third wavelength light for further hardening (e.g., for further polymerization or cross-linking). Preferably exposure to the third wavelength is carried out after separation of the partially hardened object from the volume in which it is formed Preferably exposure of the second photoinitiator to light at the third wavelength induces alteration or more preferably alters, typically by a crosslinking or polymerization reaction, at least one chemical or physical property of any unaltered photohardenable composition to further harden the object.

Preferred first photoinitiators include photoswitchable photoinitiators. Photoswitchable photoinitiators for inclusion in a photohardenable composition in accordance with the present invention preferably possess photochromic properties and can be converted to a second form (or activated form) upon irradiation with light of a first wavelength, which second form can be converted to an excited state upon irradiation with light of a second wavelength, the second form being capable of inducing a crosslinking or polymerization reaction in the photohardenable resin component. The conversion of the photoswitchable photoinitiators described herein to a second form (or activated form) of the molecule (e.g., an isomer thereof) is preferably a reversible photochemical structural change.

Several considerations in selecting a particular photoswitchable photoinitiator for inclusion in a photohardenable composition or method in accordance with the present invention include, by way of example, but not limited to, the absorption spectra and $\Delta_{max}$ of the molecule and its second forms, the solubility of the photoswitchable photoinitiator in the photohardenable resin component, the photosensitivity of the second form of the photoswitchable photoinitiator, the amount of initial concentration of the second form in the monomer solution, the stability of the photoswitchable photoinitiator and the reduction and oxidation potentials of the second form of the photoswitchable photoinitiator.

Preferred photoswitchable photoinitiators include, but are not limited to, photochromic molecules, (e.g., but not limited to, a benzospiropyran molecule, a naphthopyran molecule, a spironaphthoxazine molecule, a diarylethene molecule) which photochromic molecules can more preferably include one or more functional groups attached thereto. Such photochromic molecules can undergo a reversible intramolecular transformation forming an active form of the molecule by irradiation (photochromic). Such preferred photoswitchable photoinitiators, e.g., in the case of benzospiropyrans, naphthopyrans, and spironaphthoxazines, can function by light activated opening of the photoswitchable photoinitiator to form the activated form upon exposure to a first wavelength. In the case of diarylethenes, the activation process instead involves a ring-closing. The active form may subsequently absorb light of a different second wavelength to form an excited state of the active form which may subsequently induce photoinitiation, either alone or in combination with a coinitiator (e.g., amine, thiol, organoborate compounds, onium salts).

Photohardenable compositions including a first photoinitiator comprising a photoswitchable photoinitiator in accordance with a preferred embodiment the present invention are particularly suitable for use in the methods of the present invention for forming three-dimensional objects. The photoswitchable photoinitiator molecule in its initial form and the photoinitiator molecule in its activated second form can have sufficiently distinct absorption spectra that once the initial form of the molecule is activated form, the activated form absorbs in a wavelength region where the initial form is substantially non-absorbing. In this way, the activated form can be independently excited with the second wavelength without causing unintended excitation of the initial form by the second wavelength. The second wavelength can excite the activated form to generate free radicals or otherwise induce desired hardening of the photohardenable resin component once the activated form has been generated by exposure to the first wavelength.

Examples of photoswitchable photoinitiators suitable for inclusion in the photohardenable composition in accordance with the present invention are described in International Patent Application No. PCT/US2022/037491, filed Jul. 18, 2022, of Quadratic 3D, Inc., U.S. Provisional Application No. 63/440,085 of Quadratic 3D, Inc., filed Jan. 19, 2023, U.S. Provisional Application No. 63/450,931 of Quadratic 3D, Inc., filed Mar. 8, 2023, and U.S. Provisional Patent Application No. 63/450,936 of Quadratic 3D, Inc. filed on Mar. 8, 2023, International Patent Application No. PCT/US2022/042179, filed Aug. 31, 2022, of Quadratic 3D, Inc., International Patent Application No. PCT/US2022/042183, filed Aug. 31, 2022, of Quadratic 3D, Inc., International Patent Application No. PCT/US2022/042186, filed Aug. 31, 2022, of Quadratic 3D, Inc., each of the foregoing applications being hereby incorporated herein by reference in its entirety.

Other information that may be useful in connection with the various aspects of the present inventions includes International Patent Application No. PCT/US2022/052157, filed Dec. 7, 2022, of Quadratic 3D, Inc., and International Patent Application No. PCT/US2022/039766, filed Aug. 9, 2022, of Quadratic 3D, Inc., each of the foregoing applications being hereby incorporated herein by reference in its entirety.

Additional examples of photoswitchable photoinitiators suitable for inclusion in the photohardenable composition in accordance with the present invention include photoswitchable photoinitiators comprising a first unit comprising a photochromic molecule comprising one or more rings of atoms wherein one or more of the rings of atoms includes one or more substituents, and a second unit comprising a polycyclic group including at least two fused rings of atoms, wherein at least one of the fused rings of atoms includes a carbon atom with a substituent comprising a double bonded oxygen, wherein the second unit is attached to the first unit, and wherein the first unit and the second unit lack a ring member that is common to both units, as described in U.S. Provisional Patent Application No. 63/341,594, filed May 13, 2022, of Quadratic 3D, Inc., which is hereby incorporated herein by reference in its entirety. A photoswitchable photoinitiator described therein, represented by Formula II-7 is an example of a photoswitchable photoinitiator that can be preferred. (Such photoswitchable photoinitiator is also referred to herein as 2,2'-((6-methoxy-4-phenyl-2H-benzo[h]chromene-2,2-diyl)bis(4,1-phenylene))bis(9H-thioxanthen-9-one).)

A photohardenable resin component suitable for inclusion in a photohardenable composition and/or a hardenable resin composition in accordance with the present invention can comprise any resin (e.g., a monomer, an oligomer, a prepolymer, a polymer, or a mixture including at least one the foregoing) that is photohardenable by exposure to light in the presence of a photoinitiator. Examples of photohardenable resin components useful for inclusion in a photohardenable composition and/or hardenable resin composition in accordance with the present invention include ethylenically unsaturated compounds and, more specifically, a polyethylenically unsaturated compounds. These compounds include both monomers having one or more ethylenically unsaturated groups, such as vinyl or allyl groups, and polymers having terminal or pendant ethylenic unsaturation. Such compounds are well known in the art and include, but are not limited to, acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include, but are not limited to, ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate. Preferred examples include, but are not limited to, a urethane acrylate or a urethane methacrylate.

A photohardenable resin component can optionally comprise one or more multifunctional acrylate monomers. Dipentaerythritol pentaacrylate, a pentafunctional acrylic monomer available from Sartomer as SR399 is an example of a photohardenable resin component that may be desirable for inclusion in photohardenable composition of the present invention.

Aliphatic urethane acrylates may also be desirable for use as a photohardenable resin component for inclusion in a photohardenable composition and/or hardenable resin composition described herein.

Mixtures of multifunctional acrylate monomers, such as dipentaerythritol pentaacrylate (e.g., SR399 from Sartomer), and aliphatic urethane acrylates can also be used.

A photohardenable resin component including other mixtures including one or more resin components can also be useful.

Preferably, the photohardenable resin component included in a photohardenable composition or hardenable resin composition is selected to achieve an optically transparent medium, which is desirable in processes and systems in which light, e.g., excitation light, is directed into the composition or light.

Examples of particularly preferred photohardenable resin components include, but are not limited to, free-radical-polymerizable resins, cross-linkable resins, multifunctional acrylate monomers, methacrylates, aliphatic urethane acrylates, and the like.

Optionally a solvent, preferably, for example, but not limited to, an acrylamide monomer or an acrylate monomer, can be further included in a composition described herein for mixing the photoswitchable photoinitiator in the photohardenable resin component. Other suitable solvents may also be used.

A photohardenable composition and/or a hardenable resin composition described herein can optionally include a coinitiator. (A coinitiator can also be referred to as a synergist). Optionally, one or more coinitiators can be included.

Suitable coinitiators include coinitiators which are reducing agents, oxidizing agents, or hydrogen donating compounds.

Examples of coinitiators that may be useful can be selected from among those known in the art and, more particularly, tertiary amines and organoborate salts. Iodonium salts may also be useful, particularly in combination with a borate salt. In certain embodiments, an iodonium salt may also be included in combination with a tertiary amine. Examples of other useful electron donating coinitiators are discussed by Eaton, D. F., "Dye Sensitized Photopolymerization", Advances in Photochemistry, Vol. 13, pp 427-486.

Representative examples of N,N-dialkylanilines useful in the present invention as coinitiators include 4-cyano-N,N-dimethylaniline, 4-acetyl-N,N-dimethylaniline, 4-bromo-N, N-dimethylaniline, 4-methyl-N, N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N,'N,-tetramethyl-1,4-dianiline, 4-acetamido-N,N-dimethylaniline, 2,6-diethyl-N,N-dimethylaniline, N,N,2,4,6-pentanethylaniline (PMA) and p-t-butyl-N,N-dimethylaniline.

Certain other tertiary amines are also useful coinitiators including triethylamine, triethanolamine, N-methyldiethanolamine, 2-ethyl-4-(dimethylamino)benzoate, 2-ethylhexyl-4-(dimethylamino)benzoate, etc.

Another class of useful coinitiators includes alkyl borate salts such as ammonium salts of borate anions of the formula $BR^a R^b R^c R^d$ wherein $R^a$-$R^d$ are independently selected from the group consisting of alkyl, aryl, alkaryl, allyl, aralkyl, alkenyl, alkynyl, alicyclic and saturated or unsaturated heterocyclic groups. Representative examples of alkyl groups represented by $R^a$-$R^d$ are methyl (Me), ethyl, propyl, butyl, pentyl, hexyl, octyl, stearyl, etc. The alkyl groups may be substituted, for example, by one or more halogen, cyano, acyloxy, acyl, alkoxy or hydroxy groups. Representative examples of aryl groups represented by $R^a$-$R^d$ include phenyl, naphthyl and substituted aryl groups such as anisyl and alkaryl such as methylphenyl, dimethylphenyl, etc. Representative examples of aryl groups represented by $R^a$-$R^d$ include benzyl. Representative alicyclic groups include cyclobutyl, cyclopentyl, and cyclohexyl groups. Examples of an alkynyl group aryl propynyl and ethynyl, and examples of alkenyl groups include a vinyl group. Preferably, at least one but not more than three of $R^a$, $R^b$, $R^c$, and $R^d$ is an alkyl group. Each of $R^a$, $R^b$, $R^c$, and $R^d$ can contain up to 20 carbon atoms, and they typically contain 1 to 7 carbon atoms. More preferably $R^a$-$R^d$ are a combination of alkyl group(s) and aryl-group(s) or aralkyl group(s) and still more preferably a combination of three aryl groups and one alkyl group, i.e., an alkyltriphenylborate, e.g., but not limited to, a butyltriphenyl borate.

A photohardenable composition and/or hardenable resin composition described herein can optionally include a sensitizer. Optionally, one or more sensitizers can be included.

A sensitizer can create the excited state of the photoswitchable photoinitiator via absorbing light and transferring energy to the photoswitchable photoinitiator. For example, a sensitizer can control the sensitivity of the composition and extend the spectral sensitivity of the closed form of the photoswitchable photoinitiator. Useful sensitizers include those known in the art such as acetophenone, benzophenone, 2-acetonaphthone, isopropyl thioxanthone, alkoxyketocoumarins, Esacure 3644, and the like.

Optionally, a composition described herein can include one or more coinitiators and one or more sensitizers.

Photohardenable compositions and hardenable resin compositions in accordance with the present invention preferably display non-Newtonian rheological behavior. Such rheological behavior can facilitate forming an object in a volume of a photohardenable composition and/or a hardenable resin composition described herein upon exposure to at least two different wavelengths of excitation light wherein the object remains at a fixed position or is minimally displaced in the volume of the unhardened composition during formation. Minimal displacement refers to displacement of the object being formed during its formation in the volume that is acceptable for precisely producing the intended part geometry. Such rheological behavior can also facilitate separation of the partially hardened object from the volume in which it is formed upon application of stress. While not wishing to be bound by theory, upon the application of stress, the apparent viscosity of the non-Newtonian composition can drop to a lower value (e.g., the steady shear viscosity) than the static value (e.g., zero shear viscosity or yield stress) allowing the unhardened composition to more easily flow off and separate from the object. Examples of such non-Newtonian rheological behavior include but are not limited to pseudoplastic fluid, yield pseudoplastic, Bingham plastic, Bingham pseudoplastic rheological behavior.

Non-Newtonian rheological behavior can be imparted to a photohardenable composition or a hardenable resin composition by further including one or more reactive components (e.g. urethane acrylate oligomers, urethane methacrylate oligomers, acrylated or methacrylated polyurethanes, acrylated or methacrylated polyurethane-ureas, acrylated or methacrylated polyesters, acrylated or methacrylated polyamides, acrylate- or methacrylate-functional block copolymers, alkenyl- or alkynyl-functional urethane oligomers, alkenyl- or alkynyl-functional polyurethanes, alkenyl- or alkynyl-functional polyurethane-ureas, alkenyl- or alkynyl-functional polyesters, alkenyl- or alkynyl-functional polyamides, alkenyl- or alkynyl-functional block copolymers, thiol-functional urethane oligomers, thiol-functional polyurethanes, thiol-functional polyurethane-ureas, thiol-functional polyesters, thiol-functional polyamides, thiol-functional block copolymers) in the photohardenable resin component and/or by further adding one or more nonreactive additives (e.g., but not limited to, one or more thixotropes and/or rheology modifiers) to the composition. Selection of the one or more of reactive components and the amounts thereof for addition to a photohardenable resin component included in a photohardenable composition and/or hardenable resin composition to impart non-Newtonian rheological behavior thereto is within the skill of the skilled artisan in the relevant art without undue experimentation. Similarly, selection of nonreactive additives and the amount(s) thereof for addition to the photohardenable composition to impart non-Newtonian rheological behavior thereto is within the skill of the skilled artisan of the relevant art without undue experimentation.

A photohardenable composition and/or hardenable resin composition described herein can preferably have a steady shear viscosity, for example, which is less than 30,000 centipoise, less than 20,000 centipoise, less than 10,000 centipoise, less than 5,000 centipoise, less than 1,000 centipoise. (Steady shear viscosity refers to the plateau value of the viscosity achieved with unidirectional constant shear, e.g., the value of the viscosity after the thixotrope network has broken up.) Steady shear viscosities may be measured at ambient (e.g., room temperature), printing temperature, or some other temperature (e.g., elevated or reduced). Measurement at printing temperature may provide advantage in determining the suitability of a photohardenable composition or a hardenable resin composition for printing. Preferred steady shear viscosities are less than 30,000 centipoise, more preferably less than 10,000 centipoise, and most preferably less than 1,000 centipoise.

Steady shear viscosity can be measured under continuous constant-rate shear, such as at shear rates ranging from about 0.00001 $s^{-1}$ to about 1000 $s^{-1}$.)

Photohardenable compositions and/or hardenable resin compositions in accordance with the present invention can further include one or more additives. Examples of additives include, but are not limited to, a filler, a thixotrope/rheology modifier, a defoamer, a stabilizer, an oxygen scavenger, a non-reactive solvent diluent, and a colorant. Any additive can be a single additive or a mixture of additives. For example, a thixotrope can comprise a single thixotrope or a mixture of two or more thixotropes. Additional information concerning additives and non-limiting examples thereof are provided below Additives are preferably selected so that they do not react with other components or additives that may be included in photohardenable compositions.

The nature of a photohardenable resin component, the amount of the first photoinitiator, the amount of second photoinitiator, and, when applicable, a coinitiator, a sensitizer, a thermally activated radical initiator, or other optional additive, included in photohardenable compositions and/or hardenable resin compositions in accordance with the present invention will vary with the particular use of the compositions, the emission characteristics of the exposure sources, the development procedures, the physical properties desired in the hardened product and other factors.

Examples of photohardenable compositions in accordance with certain aspects of the invention including one or more coinitiators and/or sensitizers will generally have compositions which fall within the following compositional ranges in parts by weight [based on 100 parts total]:

Photoswitchable photoinitiator: about 0.0001 to about 0.5, including, for example, but not limited to, about 0.0001 to about 0.1, about 0.0001 to about 0.05, about 0.0001 to about 0.02, about 0.0001 to about 0.01, about 0.0001 to about 0.009, about 0.0001 to about 0.005, from about 0.0001 to about 0.0025, etc.

Second photoinitiator: about 0.0001 to about 25%, including, for example, but not limited to, about 0.0001 to about 10, about 0.0001 to about 7.5, about 0.0001 to about 5, about 0.0001 to about 2.5, about 0.0001 to about 1, from about 0.0001 to about 0.5, etc.

Coinitiators (optional) about 0.001 to about 10 including, for example, but not limited to, about 0.001 to about 7.5, about 0.001 to about 5, about 0.001 to about 2.5, about 0.001 to about 1, about 0.001 to about 0.5, from about 0.001 to about 0.25, etc.

Sensitizer (optional) about 0.1 to about 1, including, for example, but not limited to, about 0.1 to about 0.75, about 0.1 to about 0.5, about 0.1 to about 0.25, etc.

Photohardenable resin component—the balance of the photohardenable composition

Examples of photohardenable compositions in accordance with certain aspects of the invention not including one or more coinitiators and/or sensitizers will generally have compositions which fall within the following compositional ranges in parts by weight [based on 100 parts total]:

Photoswitchable photoinitiator: about 0.0001 to about 0.5, including, for example, but not limited to, about 0.0001 to about 0.1, about 0.0001 to about 0.05, about 0.0001 to about 0.02, about 0.0001 to about 0.01, about 0.0001 to about 0.009, about 0.0001 to about 0.005, from about 0.0001 to about 0.0025, etc.

Second photoinitiator: about 0.0001 to about 25, including, for example, but not limited to, about 0.0001 to about 10, about 0.0001 to about 7.5, about 0.0001 to about 5, about 0.0001 to about 2.5, about 0.0001 to about 1, from about 0.0001 to about 0.5, etc.

Photohardenable resin component—the balance of the photohardenable composition.

The weight percent of the photohardenable resin component in the above exemplary compositions can be less than 10 weight percent, e.g., less than five weight percent, less than 3 weight percent, less than 2 weight percent, or one weight percent or less, in some cases such as printing of hydrogels where the remainder of the resin is then comprised of non-reactive components that are suspended within the final photohardened resin.

The above describes compositions and compositional ranges for non-limiting examples of photohardenable compositions in accordance with the invention. Variations of the above examples of the photohardenable composition described herein and compositional ranges for the constituents included therein may also be determined to be suitable and within the scope of the present invention.

In accordance with another aspect of the present invention, there is provided a hardenable resin composition useful for forming an object, the composition comprising: a photohardenable resin component, a first photoinitiator that is activatable by exposure to light at a first wavelength and light at a second wavelength to induce a crosslinking or polymerization reaction in the photohardenable composition, a second photoinitiator that is activatable by exposure to light at a third wavelength, wherein the first, second, and third wavelengths are not the same and the third wavelength is shorter than the first wavelength and the second wavelength, and a resin component that is hardenable by a thermally driven reaction or mechanism, the resin component comprising a monomer, an oligomer, a pre-polymer, a polymer, or a mixture including at least one the foregoing.

Preferably the second photoinitiator comprises a free-radical photoinitiator.

Preferably the third wavelength is shorter than the first wavelength which in turn is shorter than the second wavelength.

A second photoinitiator comprising a Type I free-radical photoinitiator can be preferred.

Preferred first photoinitiators activatable by exposure to light at a first wavelength and light at a second wavelength include photoswitchable photoinitiators.

Preferably the second photoinitiator shows no or minimal absorption of the first wavelength and the second wavelength.

It can be desirable for the second photoinitiator not to be activatable or appreciably activatable by the first or second wavelengths to avoid undesired reactions in the photohardenable composition in the absence of exposure to the third wavelength.

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the partially hardened object.

The third wavelength may further excite the dual-wavelength photoinitiator included in the object resulting from exposure to the first and second wavelengths to further harden the object.

Information and examples relating to the photohardenable resin component, first photoinitiator that is activatable by exposure to light at a first wavelength and light at a second wavelength to induce a crosslinking or polymerization reaction in the photohardenable composition, and second photoinitiator that is activatable by exposure to light at a third wavelength, wherein the first, second, and third wavelengths are not the same and the third wavelength is shorter than the first wavelength and the second wavelength, are provided above.

Similarly, for information and examples relating to coinitiators, sensitizer, and non-Newtonian rheological behavior, imparting such behavior to a printing composition, steady shear viscosity, and other information useful for the hardenable resin composition is provided above.

A hardenable resin including a photohardenable resin component and first photoinitiator that is activatable by exposure to light at a first wavelength and light at a second wavelength to induce a crosslinking or polymerization reaction in the photohardenable composition can further include one or more coinitiators and/or one or more sensitizers. Coinitiators and sensitizers and non-limiting examples thereof are discussed above.

A bardenable resin composition in accordance with the present invention can optionally further include any one or more of a thixotrope: a stabilizer; a light blocker comprising a light absorbing pigment or dye; a non-reactive solvent diluent; a filler; a defoamer; an oxygen scavenger; a catalyst; and a thermally activated radical initiator. Other additives may alternatively or additionally be included. Additional information concerning additives and non-limiting examples thereof are provided below.

Additives are preferably selected so that they do not react with other components or additives that may be included in photohardenable compositions.

The nature of the photohardenable resin component, the resin component hardenable by a thermally driven reaction or mechanism, the amount of the first photoinitiator, the amount of second photoinitiator, and, when applicable, a coinitiator, a sensitizer, a thermally activated radical initiator, or other optional additive, included in hardenable compositions in accordance with the present invention will vary with the particular use of the compositions, the emission characteristics of the exposure sources, the development procedures, the physical properties desired in the hardened product and other factors.

A hardenable resin composition in accordance with the invention includes a resin component that is bardenable by a thermally driven reaction or mechanism. Examples of preferred thermally driven reactions or mechanisms include, but are not limited to, heating (e.g., the direct or indirect application of heat or thermal energy, irradiation with microwaves, irradiation with UV, visible, or infrared light for purpose of heating). A resin component can comprise a monomer, an oligomer, a pre-polymer, a polymer, or a mixture including at least one of the foregoing.

Inclusion of one or more resin components that can be hardened by a thermally driven reaction or mechanism in the hardenable resin composition described herein can facilitate or enable formation of articles with characteristics and/or performance properties that can be suitable for end-use applications for articles formed from a resin including a photohardenable composition without the resin component may not be suitable. Examples of added properties that may be modified by the inclusion of the second resin component include, for example, but are not limited to, mechanical, thermal, electrical, dielectric, chemical resistance, moisture resistance, and biocompatibility properties. Examples include improved mechanical properties including increased tensile strength and modulus, flexural strength and modulus, compressive strength and modulus, impact strength, hardness, wear resistance, fatigue resistance, fracture toughness; improved thermal properties including increased glass transition temperature, increased heat deflection temperature, increased thermal degradation temperature, or reduced coefficients of thermal expansion; reduced moisture or solvent uptake; improved radiation resistance; improved fire resistance, flame retardancy, or char yield; improved dielectric performance (e.g., reduced dielectric constant, reduced dielectric loss constant, or increased breakdown voltage); or improved optical properties (e.g., increased refractive index).

Examples of suitable resin components include, but are not limited to, polyurethane, polyurethane-urea, and polyurea precursors; epoxy resins and epoxy curing agents; cyanate ester resins and phthalonitrile resins; maleimide resins such as bismaleimide resins, alone or with allyl curing agents; polyimide and polyamide imide precursors including but not limited to polyamic acids (e.g. poly(pyromellitic dianhydride-co-4,4'-oxydianiline) amic acid), polyamide amic acids (e.g. Torlon AI-30 and Torlon AI-50 available from Solvay), amines, acid anhydrides, and isocyanates; norbornene resins such as nadic-anhydride-terminated resins; phenolic resins; and benzoxazine resins.

A hardenable resin composition in accordance with the invention can include, for example, but without limitation, from about 0.5 to about 95, preferably from about 40 to about 95, weight percent photohardenable resin component; from about 0.0001 to about 0.05, preferably from about 0.0001 to about 0.02 weight percent photoswitchable photoinitiator; from about 0.0001 to about 25, weight percent second light activated photoinitiator, and from about 0.5 to about 95, and preferably from about 15 to about 95, weight percent resin component.

A hardenable resin composition can further include, for example, any one or more of the following:

from about 0.05 to about 15, preferably from about 0.5 to about 10, weight percent thixotrope,
from about 0.005 to about 1 weight percent defoamer,
from about 0.005 to about 10 weight percent light blocker,
from about 0.00005 to about 5 weight percent oxygen scavenger,
from about 0.05 to about 95 weight percent non-reactive solvent diluent,
from about 0.00005 to about 10 weight percent catalyst,
from about 0.05 to about 10 weight percent thermally activated radical initiator, and
from about 0.5 to about 95 weight percent filler.

The weight percent of the photohardenable resin component in the above exemplary compositions can be less than 10 weight percent, e.g., less than five weight percent, less than 3 weight percent, less than 2 weight percent, or one weight percent or less, in some cases such as printing of hydrogels where the remainder of the resin is then comprised of non-reactive components that are suspended within the final photohardened resin. Unless otherwise indicated, specified weight percent amounts are based on the total weight of the hardenable resin composition.

The nature of the photohardenable resin component, the resin component that is hardenable by a thermally driven reaction or mechanism, the amount of the first photoinitiator, the amount of second photoinitiator, and, when applicable, a coinitiator and/or a sensitizer, included in hardenable resin compositions in accordance with the present invention will vary with the particular use of the compositions, the emission characteristics of the exposure sources, the development procedures, the physical properties desired in the hardened product and other factors.

As mentioned above, photohardenable compositions and hardenable resin compositions in accordance with the present invention can further include one or more additives. Examples of additives include, but are not limited to, a filler, a thixotrope/rheology modifier, a defoamer, a stabilizer, an oxygen scavenger, a non-reactive solvent diluent, and a colorant. Any additive can be a single additive or a mixture of additives. For example, a thixotrope can comprise a single thixotrope or a mixture of two or more thixotropes.

Additives are preferably selected so that they do not react with other components or additives that may be included in compositions.

Fillers

As mentioned above, one example of an additive that may be included in photohardenable compositions and/or hardenable resin compositions in accordance with the present invention includes a filler. Optionally a filler can include a combination of one or more fillers. A fillers can be included in an amount greater than 0 to about 90 weight percent, the amount being determined by the purpose for the filler and the desired end use characteristics for the intended three-dimensional object. Advantageously, fillers may be selected to maintain the optical transparency of the photohardenable composition and/or hardenable resin composition, e.g., by controlling particle size to be substantially less than the excitation wavelengths or by matching the refractive indices of the filler and matrix to reduce optical scatter.

Fillers may be used to modify the properties of a hardened photohardenable composition and/or hardened hardenable resin composition, for example the stiffness, strength, toughness, impact resistance, resistance to creep, resistance to fatigue, mechanical energy return, mechanical loss tangent, glass transition temperature, thermal degradation temperature, thermal conductivity, thermal resistance, moisture uptake, electrical conductivity, static dissipation, dielectric constant and loss tangent, density, refractive index, optical dispersion, opacity to ionizing radiation, and resistance to ionizing radiation. Fillers may also be used to modify the properties of the liquid (e.g., unhardened) photohardenable composition and/or liquid hardenable resin composition, such as rheological properties such as viscosity and thixotropy and optical properties such as refractive index. Examples of fillers include but are not limited to silica, alumina, zirconia; silicates glasses such as soda-lime glass, borosilicate glass, sodium silicate glass, lead glass, aluminosilicate glass, barium glass, thorium glass, glass ceramics; chalcogenide glasses; glass microspheres and microbubbles; nanoclays such as laponite, montmorillonite, bentonite, kaolinite, hectorite, and halloysite; calcium phosphate minerals such as hydroxyapatite, mineral fillers such as chalk, rock dust, slag dust, fly ash, hydraulic cement, loess, limestone, kaolin, talc, and wollastonite. Examples of particle size ranges include but are not limited to less than 10 microns, less than 1 micron, 10 nm to 500 nm, 10 nm to 90 nm, 40 nm to 70 nm. Smaller particles sizes, in particular sizes less than about 100 nm, may be beneficial to provide high optical clarity of the liquid composition to better facilitate printing. Controlling the particle size distribution, for example monodisperse, bimodal, or trimodal distributions of sizes, may be beneficial to control rheological properties, increase filler weight percent, or modify the properties of a photohardenable composition and/or hardenable resin composition.

Thixotrope/Rheology Modifier

Other examples of additives that may be included in photohardenable compositions and/or hardenable resin compositions in accordance with the present invention include a thixotropes and rheology modifiers. Thixotropes and rheology modifiers suitable for inclusion in a photohardenable composition and/or hardenable resin composition described herein include, for example and without limitation, urea derivatives; modified urea compounds such as Rheobyk 410 and Rheobyk-D 410 available from BYK-Chemie GmbH, part of the ALTANA Group; fumed metal oxides (also referred to as pyrogenic metal oxides) including for example, but not limited to, fumed silica, fumed alumina; zirconia; precipitated metal oxides including for example, but not limited to, precipitated silica, precipitated alumina; unmodified and organo-modified phyllosilicate clays; dimer and trimer fatty acids; polyether phosphates; oxidized polyolefins; hybrid oxidized polyolefins with polyamide; alkali soluble/swellable emulsions; cellulosic ethers; hydrophobically-modified alkali soluble emulsions; hydrophobically-modified ethylene oxide-based urethane; sucrose benzoate; ester terminated polyamides; tertiary amide terminated polyamides; polyalkyleneoxy terminated polyamides; polyether amides; acrylamidomethyl-substituted cellulose ester polymers; polyethyleneimine; polyurea; organoclays; hydrogenated castor oil; organic base salts of a clay mineral (e.g., montmorillonite) and other silicate-type materials; aluminum, calcium, and zinc salts of fatty acids, such as lauric or stearic acid.

See U.S. Pat. No. 6,548,593 of Merz, et al., issued Apr. 15, 2003, and U.S. Pat. No. 9,376,602 of Walther, et al. issued Jun. 28, 2016, which are hereby incorporated herein by reference in their entireties, for information relating to urea derivatives that may be useful as thixotropes.

Thermally reversible gellants such as ester terminated polyamides, tertiary amide terminated polyamides, polyalkyleneoxy terminated polyamides, and polyether amides, and combinations thereof, may be desirable for us as thixotropes. Examples include Crystasense LP1, Crystasense LP2, Crystasense LP3, Crystasense MP, Crystasense HP4, Crystasense HP5, Rheoptima X17, Rheoptima X24, Rheoptima X38, Rheoptima X58, Rheoptima X73, and Rheoptima X84 available from Croda. Crystasense HP-5 is a preferred example of a thixotrope.

Metal oxides that have been surface-treated to impart dispersibility characteristics compatible with a photohardenable composition and/or hardenable resin composition described herein may be desirable for use as thixotropes.

A thixotrope can be included in a photohardenable composition and/or a hardenable resin composition described herein in an amount, for example, in a range from about 0.05 weight percent to about 15 weight percent, from about 0.5 weight percent to about 15 weight percent, from about 0.5 weight percent to about 10 weight percent from about 1 to about 10 weight percent of the composition. Other amounts may also be determined to be useful.

A thixotrope is preferably included in a photohardenable composition and/or a hardenable resin composition described herein in an amount effective to restrict movement of the three-dimensional object or one or more regions thereof in the photohardenable composition during formation.

More preferably, the thixotrope is included in a photohardenable composition and/or a hardenable resin composition in an amount effective to restrict movement of the three-dimensional object suspended (without contact with a container surface) in the volume of composition during formation. Most preferably the position of the object in the volume of the photohardenable composition and/or hardenable resin composition remains fixed position during formation of the object.

Defoamer

Another example of additives that can be included in a photohardenable composition and/or hardenable resin composition described herein includes defoamers. A defoamer can be included to aid in removing bubbles introduced during processing and handling. A preferred defoamer is BYK 1798 (a silicone based defoamer) available from BYK-Chemie GmbH, part of the ALTANA Group.

Stabilizer

Another example of additives that can be included in a photohardenable composition and/or a hardenable resin composition described herein includes a stabilizer. A stabilizer can be included to improve shelf-life of the composition and/or to control the level of cure and/or spatial resolution during printing. An example of preferred stabilizer is TEMPO (2,2,6,6-tetramethylpiperidinooxy free radical available from Sigma-Aldrich). Examples of other stabilizers include, but are not limited to, hindered phenols such as butylated hydroxytoluene; hydroquinone and its derivatives such as hydroquinone methyl ether; hindered amine light stabilizers; alkylated diphenylamines; and phosphite esters.

Oxygen Scavenger

Another optional additive that can be included in a photohardenable composition and/or a hardenable resin composition described herein includes an oxygen scavenger that can be included to react with oxygen (e.g., singlet oxygen, dissolved oxygen) present in the composition.

Optionally an additive comprising a non-reactive solvent diluent can be included. Examples include, but are not limited to, acetone, amyl acetate, n-butanol, sec-butanol, tert-butanol, butyl acetate, cyclohexanone, decane, dimethylacetamide, dimethylformamide, dimethylsulfoxide, dipropylene glycol, dipropylene glycol methyl ether, ethanol, ethyl acetate, ethylene glycol, glycerol, heptane, isopropanol, isopropyl acetate, methyl ethyl ketone, N-methyl pyrrolidone, propylene carbonate, propylene glycol, propylene glycol diacetate, tetrahydrofuran, tripropylene glygol methyl ether, toluene, water, xylenes.

Thermally Activated Radical Initiator

It may also be desirable to include a thermally activated radical initiator in a photohardenable composition and/or hardenable resin composition described herein. Thermally activated radical initiator examples include but are not limited to 2,2'-azobis(2-methylpropionitrile), 1,1'-azobis(cyclohexanecarbonitrile), 2,2'-azobis[N-(2-carboxyethyl)-2-methylpropionamidine] n-hydrate, 2,2'-azobis[2-methyl-N-(2-hydroxyethyl) propionamide], organic peroxides, inorganic peroxides, peroxydisulfate salts.

Unless otherwise indicated, specified weight percents are based on the total weight of the photohardenable composition.

The nature of the photohardenable resin component, the amount of the first photoinitiator, the amount of second photoinitiator, and, when applicable, a coinitiator and/or a sensitizer, included in photohardenable compositions in accordance with the present invention will vary with the particular use of the compositions, the emission characteristics of the exposure sources, the development procedures, the physical properties desired in the hardened product and other factors.

Preferably a hardenable resin composition can include a photohardenable composition described herein and a resin component that is hardenable by a thermally driven reaction or mechanism, the resin component comprising a monomer, an oligomer, a pre-polymer, a polymer, or a mixture including at least one the foregoing. It may further be desirable to include a thermally activated radical initiator.

In accordance with another aspect of the invention, there is provided a method of forming an object, the method comprising:

providing a volume of a photohardenable composition comprising a photohardenable resin component, a first photoinitiator that is activatable by exposure to light at a first wavelength and light at a second wavelength to alter, typically by a crosslinking or polymerization reaction in the photohardenable composition, at least one chemical or physical property of the photohardenable composition, and a second photoinitiator that is activatable by exposure to light at a third wavelength, wherein the first, second, and third wavelengths are not the same and the third wavelength is shorter than the first wavelength and the second wavelength;

selectively irradiating the photohardenable composition at a series of selected locations in the volume with light at the first wavelength and light at the second wavelength to form a partially hardened object in the volume of the photohardenable composition; and irradiating the partially hardened object with light at a third wavelength to further harden the object.

Preferably the second photoinitiator comprises a free-radical photoinitiator.

Preferably the partially hardened object is separated or removed from the volume prior to irradiation with light at the third wavelength.

A photohardenable composition preferably comprises a photohardenable composition described herein.

The first photoinitiator preferably includes a first photoinitiator described herein.

Preferred first photoinitiators activatable by exposure to light at a first wavelength and light at a second wavelength include photoswitchable photoinitiators.

A second photoinitiator preferably includes a second photoinitiator described herein.

A second photoinitiator comprising a Type I free-radical photoinitiator can be preferred.

Preferably the second photoinitiator shows no or minimal absorption of the first wavelength and the second wavelength.

Preferably the third wavelength is not directed into the volume during formation of the partially hardened object therein.

It can be desirable for the second photoinitiator not to be activatable or appreciably activatable by the first or second wavelengths to avoid undesired reactions in the photohardenable composition in the absence of exposure to the third wavelength.

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object.

Preferably the photohardenable composition comprises a photohardenable composition in accordance with the present invention.

The third wavelength may further excite any dual-wavelength photoinitiator that may be included in the object resulting from exposure to the first and second wavelengths to further harden the object.

As mentioned above, preferably the third wavelength is shorter than the first wavelength which in turn is shorter than the second wavelength.

Preferably the photohardenable composition displays non-Newtonian rheological behavior.

Examples of first and second wavelength ranges for use in methods of the present invention that include a photohardenable composition and/or a hardenable resin composition described herein include a first wavelength in a range from 300 nm to about 550 nm, for example, but not limited to, from about 350 to about 460 nm, from about 350 to about 455 nm, from about 350 nm to about 445 nm, from about 350 nm to about 410 nm, from about 375 nm to about 455 nm, from about 375 nm to about 445 nm, from about 375 nm to about 410 nm, and from about 375 nm to about 405 nm, and a second wavelength in a range from about 450 nm to about 1000 nm, for example, but not limited to, from about 450 nm to about 850 nm most typically, from about 450 nm to about 700 nm.

Second photoinitiators that can be desirable for use with such first photoinitiators are preferably activatable at a third wavelength less than the first and second wavelength.

Examples of first and second wavelength ranges that may be desirable for use in methods of the present invention that include a photohardenable composition described herein that includes a preferred first photoinitiator comprising a photoswitchable photoinitiator include a first wavelength in a range from about 300 nm to about 550 nm and a second wavelength in a range from about 450 nm to about 700 nm. Other ranges for first and second wavelengths provided herein may also be desirable.

Methods including photohardenable compositions including first photoinitiators that are activatable at first and second wavelengths in other ranges may also be suitable. In such cases, a second photoinitiator is preferably selected to be responsive to a third wavelength that is shorter than the first wavelength and the second wavelength. Preferably the third wavelength is shorter than the first wavelength which in turn is shorter than the second wavelength.

Preferably the photohardenable composition displays non-Newtonian rheological behavior.

In accordance with still another aspect of the invention, there is provided a method of forming an object, the method comprising:

providing a volume of a photohardenable composition comprising a photohardenable resin component, a first photoinitiator that is activatable by exposure to light at a first wavelength and light at a second wavelength to alter, typically by a crosslinking or polymerization reaction in the photohardenable composition, at least one chemical or physical property of the photohardenable composition, and a second photoinitiator that is activatable by exposure to light at a third wavelength, wherein the first, second, and third wavelengths are not the same, and the third wavelength is shorter than the first wavelength and the second wavelength;

irradiating the photohardenable composition at one or more selected locations in the volume with light at the first wavelength and light at the second wavelength to partially harden the photohardenable composition at the one or more selected locations to at least partially form a partially hardened object;

optionally repeating the irradiating step one or more times wherein for a repeated step the one or more selected locations are the same as or different from any previous one or more selected locations, to form the partially hardened object;

separating or removing the partially hardened object from the volume; and irradiating the partially hardened object with light at a third wavelength to further harden the object.

Preferably the partially hardened object has the same shape as or a shape to be imparted to the object.

A photohardenable composition preferably comprises a photohardenable composition described herein.

Preferred first photoinitiators activatable by exposure to light at a first wavelength and light at a second wavelength include photoswitchable photoinitiators.

Second photoinitiators preferably comprise second photoinitiators described herein.

A second photoinitiator comprising a Type I free-radical photoinitiator can be preferred.

Preferably the second photoinitiator shows no or minimal absorption of the first wavelength and the second wavelength.

Preferably the third wavelength is not directed into the volume during formation of the partially hardened object therein.

It can be desirable for the second photoinitiator not to be activatable or appreciably activatable by the first or second wavelengths to avoid undesired reactions in the photohardenable composition in the absence of exposure to the third wavelength.

Exposure of the second photoinitiator to light at the third wavelength can advantageously induce alteration or alter, typically by a crosslinking or polymerization reaction in the photohardenable composition, at least one chemical or physical property of previously unaltered photohardenable composition included in the object.

The third wavelength may further excite any dual-wavelength photoinitiator that may be included in the object resulting from exposure to the first and second wavelengths to further harden the object.

As mentioned above, preferably the third wavelength is shorter than the first wavelength which in turn is shorter than the second wavelength.

Preferably the photohardenable composition displays non-Newtonian rheological behavior.

Examples of first and second wavelength ranges for use in methods of the present invention that include a photohardenable composition and/or hardenable resin composition described herein include a first wavelength in a range from 300 nm to about 550 nm, for example, but not limited to, from about 350 to about 460 nm, from about 350 to about 455 nm, from about 350 nm to about 445 nm, from about 350 nm to about 410 nm, from about 375 nm to about 455 nm, from about 375 nm to about 445 nm, from about 375 nm to about 410 nm, and from about 375 nm to about 405 nm, and a second wavelength in a range from about 450 nm to about 1000 nm, for example, but not limited to, from about 450 nm to about 850 nm most typically, from about 450 nm to about 700 nm.

Second photoinitiators that can be desirable for use with such first photoinitiators are preferably activatable at a third wavelength less than the first and second wavelength.

Examples of first and second wavelength ranges that may be desirable for use in methods of the present invention that include a photohardenable composition described herein that includes a preferred first photoinitiator comprising a photoswitchable photoinitiator include a first wavelength in a range from about 300 nm to about 550 nm and a second wavelength in a range from about 450 nm to about 700 nm. Other ranges for first and second wavelengths provided herein may also be desirable.

Methods including photohardenable compositions including first photoinitiators that are activatable at first and second wavelengths in other ranges may also be suitable. In such cases, a second photoinitiator is preferably selected to be responsive to a third wavelength that is shorter than the first wavelength and the second wavelength. Preferably the third wavelength is shorter than the first wavelength which in turn is shorter than the second wavelength.

Preferably the photohardenable composition displays non-Newtonian rheological behavior.

In accordance with another aspect of the present invention, there is provided a method of forming an object, the method comprising:

(a) providing a volume of a hardenable resin composition, wherein hardenable resin composition comprises a photohardenable resin component, a first photoinitiator that is activatable by exposure to light at a first wavelength and light at a second wavelength to induce a crosslinking or polymerization reaction in the photohardenable composition, a second photoinitiator that is activatable by exposure to light at a third wavelength, wherein the first, second, and third wavelengths are not the same and the third wavelength is shorter than the first wavelength and the second wavelength, and a resin component that is hardenable by a thermally driven reaction or mechanism, the resin component comprising a monomer, an oligomer, a pre-polymer, a polymer, or a mixture including at least one the foregoing, (b) forming an initial print from the hardenable resin composition, wherein formation of the initial print comprises:

(i) simultaneously or sequentially irradiating one or more selected locations within the volume of the hardenable resin composition with light having a first wavelength and light having a second wavelength, wherein light having the first wavelength and light having the second wavelength activate the photoswitchable photoinitiator at the one or more selected locations to induce a crosslinking or polymerization reaction in the photohardenable composition at the intersection of the first and second wavelengths at the one or more selected locations within the volume to at least partially form the initial print; and (ii) optionally repeating step (i) at one or more of the same or different selected locations within the volume of the hardenable resin composition until the initial print is formed; and (c) irradiating the initial print with light at a third wavelength to further harden the initial print.

The method can further include separating or removing the initial print from the volume prior to step (c).

The method can further include heating the object during or after irradiation with light at the third wavelength to further harden the object.

Preferred hardenable compositions include hardenable compositions described herein.

It may be desirable to further include a thermally activated radical initiator in a photohardenable composition and/or hardenable resin composition described herein.

Optionally, the methods described herein can further include washing the object after removal or separation from the volume in which it is formed after exposure to the first and second wavelengths. It can be desirable to wash the separated object prior to irradiating it with light of the third wavelength.

The first photoinitiator preferably includes a first photoinitiator described herein.

Preferred first photoinitiators activatable by exposure to light at a first wavelength and light at a second wavelength include photoswitchable photoinitiators.

A second photoinitiator preferably includes a second photoinitiator described herein.

A second photoinitiator comprising a Type I free-radical photoinitiator can be preferred.

Preferably the second photoinitiator shows no or minimal absorption of the first wavelength and the second wavelength.

Preferably the third wavelength is not directed into the volume during formation of the partially hardened object therein.

It can be desirable for the second photoinitiator not to be activatable or appreciably activatable by the first or second wavelengths to avoid undesired reactions in the photohardenable composition and/or hardenable resin composition in the absence of exposure to the third wavelength.

Exposure of the second photoinitiator to light at the third wavelength can advantageously induce alteration or alter, typically by a crosslinking or polymerization reaction in the photohardenable resin component included in a photohardenable composition and/or hardenable resin composition, at least one chemical or physical property of previously unaltered photohardenable resin component included in the object.

Preferably methods including a photohardenable composition include a photohardenable composition in accordance with the present invention.

The third wavelength may further excite any dual-wavelength photoinitiator that may be included in the object resulting from exposure to the first and second wavelengths to further harden the object.

As mentioned above, preferably the third wavelength is shorter than the first wavelength which in turn is shorter than the second wavelength.

Examples of first and second wavelength ranges for use in methods of the present invention that include a photohardenable composition and/or a hardenable resin composition described herein t include a first wavelength in a range from 300 nm to about 550 nm, for example, but not limited to, from about 350 to about 460 nm, from about 350 to about 455 nm, from about 350 nm to about 445 nm, from about 350 nm to about 410 nm, from about 375 nm to about 455 nm, from about 375 nm to about 445 nm, from about 375 nm to about 410 nm, and from about 375 nm to about 405 nm, and a second wavelength in a range from about 450 nm to about 1000 nm, for example, but not limited to, from about 450 nm to about 850 nm most typically, from about 450 nm to about 700 nm.

Second photoinitiators that can be desirable for use with such first photoinitiators are preferably activatable at a third wavelength less than the first and second wavelength.

Examples of first and second wavelength ranges for use in methods of the present invention that include a photohardenable composition and/or a hardenable resin composition described herein that includes a preferred first photoinitiator comprising a photoswitchable photoinitiator include a first wavelength in a range from about 300 nm to about 550 nm and a second wavelength in a range from about 450 nm to about 700 nm. Other ranges for first and second wavelengths provided herein may also be desirable.

Second photoinitiators that can be desirable for use with such first photoinitiators are preferably activatable at a third wavelength less than the first and second wavelengths. Examples of ranges for a third wavelength, taking depending upon the first and second wavelengths into consideration, that may be useful include, but are not limited to, about 200 nm to about 445 nm, from about 200 to about 400 nm, from about 240 nm to about 400 nm, etc.

Methods including photohardenable compositions and/or hardenable resin composition including first photoinitiators that are activatable at first and second wavelengths in other ranges may also be suitable. In such cases, a second photoinitiator is preferably selected to be responsive to a third wavelength that is shorter than the first wavelength and the second wavelength. Preferably the third wavelength is shorter than the first wavelength which in turn is shorter than the second wavelength.

In methods described herein, the photohardenable composition and/or the hardenable resin composition preferably displays non-Newtonian rheological behavior.

Methods in accordance with certain aspects of the present invention including a photohardenable composition and/or a hardenable resin composition that demonstrates non-Newtonian rheological behavior can facilitate forming an object, preferably a three-dimensional object, which is fully suspended in the volume of the composition during formation. The ability to have the object fully suspended in the volume during formation advantageously eliminates the need to include support structures of the type used in stereolithography to maintain the geometry/shape of the object during formation (which is sometimes referred to as printing or 3D printing).

For use in forming objects, e.g., three-dimensional objects, it is desired that photohardenable compositions and/or hardenable resin compositions do not harden (e.g., the photohardenable resin component included therein does not undergo polymerization or cross-linking) upon exposure of the composition to only the first wavelength or only the second wavelength. In other words, photohardenable composition and/or hardenable resin composition in the volume which is not simultaneously or nearly simultaneously (e.g., due to the closely timed sequential exposure) exposed to both radiations does not polymerize or cross-link. In particular, in scanning a volume of the photohardenable media, as a result of beams or other configurations of light passing through previously exposed areas or planes, there will be numerous points or regions in the volume which are sequentially scanned in any order with the first wavelength radiation and the second wavelength radiation as the structure of the object is defined in the volume of the medium by the intersection of the beams or other configurations of light. Some points or regions may also experience multiple exposures to the first wavelength light and/or second wavelength light. Preferably points receiving such multiple sequential (non-simultaneous) exposures do not polymerize.

Preferably the amount of time during which one or more selected locations within the volume are simultaneously or sequentially exposed to the first wavelength light and the second wavelength light is sufficient to induce, e.g., a crosslinking or polymerization reaction in photohardenable media at the one or more selected locations and is insufficient to induce a crosslinking or polymerization reaction in the photohardenable media when only one of the first and second wavelengths is present.

Preferably light including the first wavelength and light including the second wavelength are separately directed into the volume. More preferably the light including the first wavelength is directed into the volume along a first illumination axis that is orthogonal to the second illumination axis along which the light including the second wavelength is directed into the volume.

Preferably the third wavelength is not directed into the volume during formation of the partially hardened object therein.

Preferably the light including the first wavelength comprises a light sheet.

A light sheet can comprise a planar configuration of light with opposed major faces with the major faces being parallel to first illumination axis along which the light sheet is directed into the volume.

Preferably the light including the second wavelength comprises an optical image that is oriented perpendicular to the second illumination axis along which the optical image is projected into the volume. A digital micromirror device (DMD) is preferably utilized in the projection of the optical image.

An optical image can include any optical projection generated by an optical projection system. Examples of optical images include, without limitation, a patterned or unpatterned two-dimensional image, a line of light, or a single point of light. A two-dimensional image can comprise a cross-sectional plane of the three-dimensional image being printed. A two-dimensional image can represent a cross-sectional slice of an object to be printed. Such cross-sectional slice is typically generated using slicing software, as discussed elsewhere herein.

In a preferred embodiment, a first illumination axis along which the light sheet is directed into the volume and a second illumination axis (also referred to herein as the optical projection axis) along which the optical image is directed into the volume are orthogonal to each with the optical image being orthogonal to the second illumination axis such that the light sheet and optical image intersect in a common plane. It is desirable for the intersection of the light sheet and optical image to be coplanar or substantially coplanar.

Preferably the method further comprises separating or removing the partially hardened object resulting from selective exposure of the photohardenable composition and/or hardenable resin composition to the first and second wavelength from the remaining unaltered volume in which it is formed.

More preferably the method comprises separating or removing such partially hardened object from the volume of the remaining liquid composition in which it is formed before irradiating the partially hardened object with light at the third wavelength to further photoharden the partially hardened object separated or removed from the volume of photohardenable composition.

Optionally, the method can include washing the partially hardened object after removal or separation from the volume of the remaining unaltered composition.

As discussed herein, It can be desirable to wash the partially hardened object prior to irradiating it with light of the third wavelength for further photohardening.

Separation of the partially hardened object from the volume of volume of the remaining unaltered composition may be conducted by a number of means known in the art, e.g., gravity draining, sieving, air blade, centrifugation, vibration, or ultrasonic agitation.

Washing may be carried out with any suitable organic or aqueous wash liquid, or combination thereof, including solutions, suspensions, emulsions, microemulsions, etc. Examples of suitable wash liquids include, but are not limited to water, alcohols (e.g., methanol, ethanol. isopropanol. etc.), glycol ethers, benzene, toluene, etc. Wash liquids including a mixture of two or more liquids (e.g., water and an alcohol (e.g., isopropanol) may also be suitable. Such wash solutions may optionally contain additional constituents such as surfactants, etc.

Optionally after exposure to the third wavelength, the further hardened object can be further post-processed. Examples of optional further post processing treatments can include, but are not limited to, washing, post-curing (e.g., by light, e-beam, heat, non-ionizing radiation, ionizing radiation, pressure, humidity, or simultaneous or sequential combinations of techniques), metrology, freeze-dry processing, critical point drying, and packaging.

It may be desirable for photohardenable compositions and hardenable resin composition included in a method in accordance with the present invention to further include a thermally activated radical initiator.

A printed object prepared from a hardenable resin composition including a resin component that is hardenable by a thermally driven reaction or mechanism can be referred to as a "green" object prior to post-curing including a thermally-driven reaction or mechanism to harden the thermally hardenable resin component).

In a method described herein including a hardenable resin composition, after the initial print is formed, it is preferably separated or removed from the hardenable resin composition, optionally washed, any other optional modifications made, before irradiation with third wavelength light. Post-processing can further include subjecting the removed or separated, and optionally washed, and optionally further modified part to a thermally driven reaction or mechanism (e.g., heated and/or microwave irradiated) sufficiently to further harden (e.g., by further reacting, further polymerizing, further chain extending) the second resin component and form the article, which can be carried out before, during, or after irradiation with the third wavelength. It may be preferred to conduct any such thermally driven reaction or mechanism following irradiation with the third wavelength.

Additional modifications to the formed article may optionally be made following the heating and/or microwave irradiating step.

Separation of a partially hardened object (e.g., the initial print) from the volume of unhardened printing composition in which it is formed may be conducted by a number of means known in the art, e.g., gravity draining, sieving, air blade, centrifugation, vibration, or ultrasonic agitation.

Washing may be carried out with any suitable organic or aqueous wash liquid, or combination thereof, including solutions, suspensions, emulsions, microemulsions, etc. Examples of suitable wash liquids include, but are not limited to water, alcohols (e.g., methanol, ethanol. isopropanol. etc.), glycol ethers, benzene, toluene, etc. Wash liquids including a mixture of two or more liquids (e.g., water and an alcohol (e.g., isopropanol) may also be suitable. Such wash solutions may optionally contain additional constituents such as surfactants, etc.

Optionally hardening by a thermally driven reaction or mechanism can comprise heating and/or microwave irradiation to further cure the same. Heating may be active heating (e.g., in an oven, such as an electric, gas, or solar oven), or passive heating (e.g., at ambient temperature). Active heating can be more rapid than passive heating and in some embodiments can be preferred. Passive heating, e.g., by maintaining the intermediate at ambient temperature for a sufficient time to effect further cure, can also be desirable. Optionally, heating can comprise heating at a first temperature for a first time period, and then heating at a second temperature for a second time period, and then heating at a third temperature for a third time period, and so on, for any number of temperatures and time periods. The temperatures and time periods may be selected to facilitate evaporation of volatiles from the article without causing damage (e.g., cracks); to facilitate more complete curing of lower temperature curing component(s) to stabilize the article shape prior to subsequent cure of higher temperature curing component(s); or to develop higher thermomechanical properties. Differential scanning calorimetry may assist in determining the temperatures and time periods appropriate for curing, by indicating the temperatures where curing reactions initiate and reach their maximum rates (e.g., in a temperature ramp experiment) as well as indicating how much time is required to complete a curing reaction (e.g., in an isothermal experiment). The time periods can be the same length or different. In certain embodiments, the first temperature can be ambient temperature or greater than ambient temperature, and each subsequent temperature can be greater than the previous. Preferably the maximum temperature is sufficient to completely or substantially completely harden or cure the hardenable resin composition but is less than the degradation temperature, e.g., the 5% mass loss temperature as measured by thermogravimetric analysis. When multiple temperatures are used, the temperature can be ramped, for example, by step-wise increases.

For example, an initial print further hardened by irradiation with the third wavelength may optionally also be heated, for example, in a stepwise manner at a first temperature in a first range, for example, from about 70° C. to about 150° C., and then at a second temperature in a second range, for example, from about 150° C. to about 200° C. or from about 150° C. to about 250° C., with the duration of each heating depending on the size and shape of the object. In another embodiment, an initial print further hardened by irradiation with the third wavelength may optionally be thermally cured by a ramped heating schedule, with the temperature ramped from a first temperature (e.g., ambient temperature or a temperature greater than ambient temperature) through a second temperature (e.g., a temperature in a range greater than the first temperature to about, for example, 150° C., and up to a final temperature (e.g., a temperature greater than the second temperature to about, for example, 250° C., at a change in heating rate of, for example 0.5° C. per minute, to 5° C. per minute, or such other rate as is determined to be useful.

An object (which may also be referred to herein as an article or a part) formed by a method described herein that optionally further includes a hardening step including a thermally driven reaction or mechanism can be the same as or different from the initial print prior to or following irradiation with third wavelength prior to further hardening including a thermally driven reaction or mechanism. For example, there can be changes as a result of, for example, shrinkage (e.g., up to 1, 2, 5, 10, 25, or 50 percent by volume), expansion (e.g., up to 1, 2, 5, 10 percent by volume), or possible optional intervening forming steps (e.g., intentional bending, stretching, drilling, grinding, cutting, polishing, or other intentional forming after formation of the initial print, but before formation of the subsequent article). The initial print can preferably be of the same shape as the article to be formed or can have a shape to be imparted to the object to be formed.

The methods in accordance with various aspects of the invention can further include post-treatment of the three-dimensional object(s) formed.

Examples of post-treatments include, but are not limited to, washing, post-curing (e.g., by light, e-beam, heat, non-ionizing radiation, ionizing radiation, time (aging), pressure, humidity, or simultaneous or sequential combinations of techniques), metrology, labelling or tracking (e.g., by barcode, QR code, or RFID tag), freeze-dry processing, critical point drying, and packaging.

In methods in accordance with the invention for forming a three-dimensional object including a composition described herein that includes a first photoinitiator comprising a photoswitchable photoinitiator, it is desirable to select a photoswitchable photoinitiator molecule for which the wavelength of first excitation has significant absorption for the first form, and where the second form of the photoinitiator has minimal absorption of the first excitation wavelength. This has two advantages, first, it simplifies exposure in that activation of the photoswitchable photoinitiator can occur without activating the second form thereof to alter, typically by a crosslinking or polymerization reaction in the photohardenable resin component included in the composition, at least one chemical or physical property of the photohardenable resin component included therein. When there is substantial overlap, the intensity of the two radiations must be carefully controlled so as to activate the photoswitchable photoinitiator molecule while minimally activating the second form thereof. Second, it can permit deeper penetration of the volume or layer of the composition as the conversion of the photoswitchable photoinitiator to the second form thereof has the effect of "bleaching" the photoswitchable photoinitiator molecule or making it transparent with respect to the first wavelength radiation.

Generally, photoswitchable photoinitiators useful in compositions in accordance with the invention can absorb first wavelength light from about 300 nm to about 550 nm. Other examples of ranges in which the photoswitchable photoinitiator will absorb first wavelength light include, but are not limited to, from about 350 to about 460 nm, from about 350 to about 455 nm, from about 350 nm to about 445 nm, from about 350 nm to about 410 nm, from about 375 to about 455 nm, from about 375 to about 445 nm, from about 375 nm to about 405 nm. Other examples are described herein. Depending upon the extinction coefficient for the particular photoswitchable photoinitiator, the conversion to the second form can be induced by exposure to any source which emits in this range, e.g., lasers, light emitting diodes, mercury lamps. Filters may be used to limit the output wavelengths. A non-limiting example of filtered light includes filtered emission from a mercury arc lamp, etc. Lasers can be preferred sources of radiation for generating radiation of the first wavelength.

The second form of the photoswitchable photoinitiator will preferably absorb second wavelength light in a range of about 450 nm to about 1000 nm, and from about 450 nm to about 850 nm most typically. Other examples of ranges in which the second form of the photoswitchable photoinitiator will preferably absorb second wavelength light include from about 450 nm to about 700 nm. This form can be activated by the second excitation light to produce free radicals directly or to produce excitons which undergo electron transfer or hydrogen abstraction (optionally via electron, hydrogen, or energy transfer to coinitiator(s) in aspects of the invention including one or more coinitiator) by exposure to any second wavelength within this range. For the second excitation, exposures may be accomplished using a laser source, an LED or LED array, the filtered emission from an arc lamp, or other suitable source with emission within the desired wavelength range. argon ion, He—Ne, laser diodes, krypton, frequency-multiplied Nd-YAG etc. Other light sources may be used, optionally with filters to limit output wavelengths, e.g., light emitting diodes, incandescent lamps, halogen lamps, mercury lamps, arc lamps, etc. Lasers can be preferred sources of radiation for generating radiation of the second wavelength.

Examples of light sources of radiation of the third wavelength include a laser source, an LED or LED array, the filtered emission from an arc lamp, or other suitable source with emission within the desired wavelength range. argon ion, He—Ne, laser diodes, krypton, frequency-multiplied Nd-YAG etc. Other light sources may be used, optionally with filters to limit output wavelengths, e.g., light emitting diodes, incandescent lamps, halogen lamps, mercury lamps, arc lamps, etc. Lasers can be preferred sources of radiation for generating radiation of the third wavelength.

Optionally, a method described herein can further include use of a fourth wavelength to force the reverse reaction of the second form of the photoswitchable photoinitiator back to the original/starting form to help avoid hardening of unwanted areas.

As used herein a wavelength can refer to a wavelength or range of wavelengths.

Methods in accordance with the invention preferably include providing a volume of a photohardenable composition or a hardenable resin composition within a container wherein at least a portion of the container is optically transparent so that the composition is accessible by excitation light. Optionally, the entire container is optically transparent.

Optically transparent portions of a container can be constructed from a material comprising, for example, but not limited to, glass, quartz, fluoropolymers (e.g., Teflon FEP, Teflon AF, Teflon PFA), cyclic olefin copolymers, polymethyl methacrylate (PMMA), polynorbornene, sapphire, or transparent ceramic.

Examples of container shapes include, but are not limited to, a cylindrical container having a circular or oval cross-section, a container having straight sides with a polygonal cross-section or a rectangular or square cross-section.

Preferably the optically transparent portion(s) of the container is (are) also optically flat.

Optionally, one or more filters can be added to at least a surface of any optically transparent portions of the container to block undesired light, e.g., room light, to prevent unintentional curing.

Optionally a printing compositions (e.g., a photohardenable composition and/or a hardenable resin composition) can be filtered to remove particulates before introduction into the container. Optionally bubbles are removed from the photohardenable composition before or after being introduced into the container.

Optionally a printing composition can be degassed, purged or sparged with an inert gas before or after being introduced into the container. Optionally the photohardenable composition is maintained under inert conditions, e.g., under an inert atmosphere, during printing. This can prevent introduction of oxygen into the container while the object is being printed or formed.

The methods disclosed herein can also include the use of commercially available optical projection and filtering techniques or systems that employ two or more optical projection methods at once.

Excitation light may be visible light, ultraviolet light, or other suitable forms of electromagnetic radiation.

In methods described herein, each wavelength is preferably generated by a different light source or different optical projection or other optical systems.

The radiation or excitation source is preferably selected to emit radiation at a wavelength or within a range of wavelengths absorbed by the particular photoinitiator, e.g., the photoswitchable photoinitiator or the second photoinitiator.

Excitation light or radiation may be applied using any suitable light or electromagnetic radiation source or optical system (which typically includes a light or electromagnetic radiation source). Examples of light or electromagnetic radiation light sources include, but are not limited to, lasers (including laser diodes) and other coherent light sources, light-emitting diodes (LEDs), micro-LED arrays, vertical cavity lasers (VCLs), and filtered lamps. Such light sources are commercially available and selection of a suitable light source can be readily made by one of ordinary skill in the relevant art. LEDs of the type such as Phlatlight LEDs available from Luminus for use with DMDs may also be suitable. Lasers can be preferred sources of radiation for generating radiation of the first, the second, the third and, if applicable, the fourth wavelengths.

Examples of projection devices suitable for use in the methods described herein may include, but are not limited to, a laser projection system, a liquid crystal display (also referred to herein as "LCD"), a spatial light modulator (also referred to herein as "SLM") (for example, but not limited to, a digital micromirror device (also referred to herein as "DMD")), a micro-LED array, a vertical cavity laser array (also referred to herein as "VCL"), a Vertical Cavity Surface Emitting Laser array (also referred to herein as "VCSEL"), a liquid crystal on silicon (also referred to herein as "LCoS") projector, and a scanning laser system. (Light emitting diode is also referred to herein as "LED").

Excitation light can be applied as an image. Examples of images include, without limitation, a line of light, a single beam of light, a two-dimensional image, a patterned image, a patterned two-dimensional image. An image can comprise a cross-sectional plane of the three-dimensional image or object being printed.

Excitation light can be applied as a light sheet. A light sheet can be constructed by means known in the art including, for example, but not limited to, techniques including a laser and a Powell lens, galvanometer, and/or polygon scanning mirror. Alternatively, one or more LEDs can be used as a light source.

As mentioned above, the first wavelength is preferably applied as a light sheet and the second wavelength is preferably applied as an optical image.

Optionally, the excitation light can be temporally and/or spatially modulated. Optionally, the intensity of the excitation light can be modulated by known or readily ascertainable techniques. Optionally, source drive modulation by known or readily ascertainable techniques can be used to adjust the absolute power of the light beam.

Spatially modulated excitation light can be used to direct or irradiate a patterned image or a two-dimensional image at one or more selected locations in the photohardenable composition.

For example, spatially modulated excitation light can be created by an optical projection system including a spatial modulation component (also referred to herein as a spatial light modulator ("SLM")). Examples of spatial modulation components for inclusion in an optical projection system include, for example and without limitation, a liquid crystal display (also referred to herein as "LCD"), a digital micromirror device (also referred to herein as "DMD")), a micro-LED array, a vertical cavity laser (also referred to herein as "VCL" or as a Vertical Cavity Surface Emitting Laser (also referred to herein as "VCSEL"), a scanning laser system, a liquid crystal on silicon (also referred to herein as "LCoS") microdisplay.

An optical projection system comprising a spatial light modulator may be utilized with incoherent light as an amplitude modulator in combination with projection lens to form images in the volume of the printing composition for amplitude base projections.

A preferred optical projection system can include a light source, projection optics, and a spatial modulation component.

An optical projection system can be selected to apply continuous excitation light. An optical system can be selected to apply intermittent excitation light. Intermittent excitation can include random on and off application of light or periodic application of light. Examples of periodic application of light includes pulsing. An optical system can be selected to apply a combination of both continuous excitation light and intermittent light, including, for example, an irradiation step that includes the application of intermittent excitation light that is preceded or followed by irradiation with continuous light.

An optical projection system can further include projection optics and/or additional components including, but not limited to, one or more translational stages for moving the system or components thereof.

The method disclosed herein can also include the use of commercially available projection and filtering techniques that can assist in providing a very narrow depth of focus or systems that employ two or more optical projection methods at once.

In some embodiments, the light or other electromagnetic radiation may be directed to one or more specific locations or regions within the print volume.

In methods described herein, power densities or intensities of excitation light directed into the volume of photohardenable composition to cause partial hardening (e.g., by polymerization, crosslinking) to occur at the one or more selected locations may be, without limitation, in a range from about 0.01 to about 100,000 $W/cm^2$.

Other power densities or intensities may also be determined to be useful.

In the methods described herein, the container optionally may be rotated to provide additional angles of illumination or projection of excitation light into the volume of photohardenable composition contained therein. This can be of assistance in patterning object volumes or surfaces more accurately or it can be used as a means of providing multiple exposure of a given feature from different angles.

In the method described herein, the container optionally may be stationary while a beam or optical projection of excitation light is being directed into the volume of the printing composition. Alternatively, the position of the container may be translated or moved during excitation while a beam and/or optical projection of excitation is being directed into the volume of the printing composition.

Before printing, a digital file of the object or object to be printed is typically obtained. If the digital file is not of a format that can be used to print the object, the digital file is then converted to a format that can be used to print the object. An example of a typical format that can be used for printing includes, but is not limited to, an STL file. Typically, the STL file is then sliced into two-dimensional layers with use of three-dimensional slicer software and converted into G-Code or a set of machine commands, which facilitates building the object. See B. Redwood, et al., "The 3D Printing Handbook—Technologies, designs applications", 3D HUBS B.V. 2018.

Other information concerning optical systems that may useful in connection with the various aspects of the present inventions includes Texas Instruments Application Report DLPA022-July 2010 entitled "DLP™ System Optics"; Texas Instruments "TI DL® Technology for 3D Printing—Design scalable high-speed stereolithography [sic] systems using TI DLP technology" 2016; Texas Instruments "DLP6500 0.65 1018 p MVSP Type A DMD", DLP6500, DLPS040A-October 2014—Revised October 2016; and Y-H Lee, et al., "Fabrication of Periodic 3D Nanostructuration for Optical Surfaces by Holographic Two-Photon-Polymerization", Int'l Journal of Information and Electronics Engineering, Vol 6, No. 3, May 2016, each of the foregoing being hereby incorporated herein by reference in its entirety.

EXAMPLES

The examples provided herein are provided as examples and not limitations, wherein a number of modifications of the exemplified compositions and processes are contemplated and within the scope of the present invention.

Example I

Example I-1

Preparation of Photoswitchable Photoinitiator represented by the Formula/Structure Designated as NP24 in the Reaction Scheme Below Preparation of NP24:

A photoswitchable photoinitiator comprising 2,2'-((6-methoxy-4-phenyl-2H-benzo[h]chromene-2,2-diyl)bis(4,1-phenylene))bis(9H-thioxanthen-9-one), represented by the formula/structure identified in the below reaction scheme as Compound No. NP24, was prepared as set forth in this Example I-1:

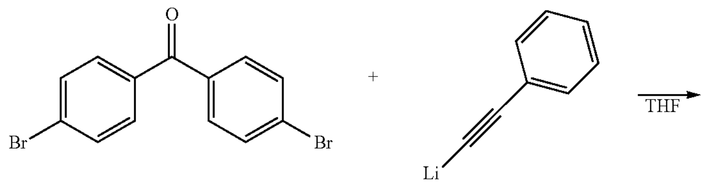
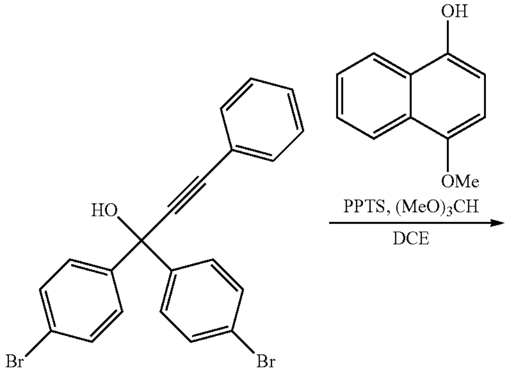
4
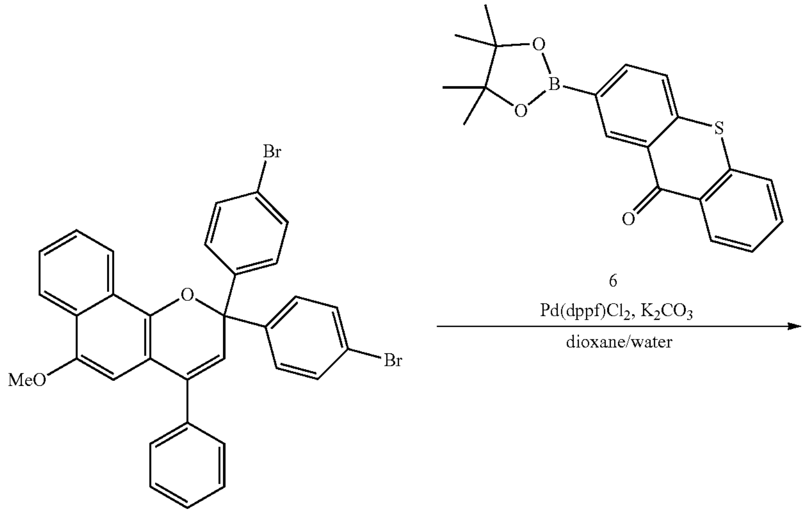
5

-continued

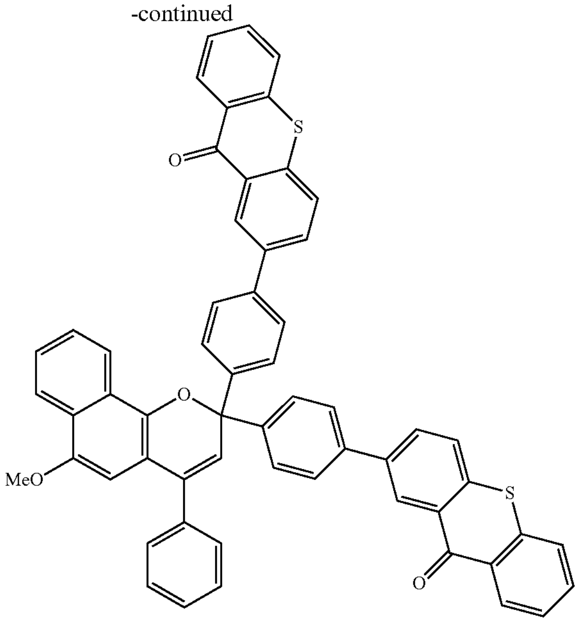

NP24

A dry 250 mL two-neck round bottom flask was placed under a nitrogen atmosphere and charged with bis(4-bromophenyl) methanone (10.0 g, 29.4 mmol, 1.0 equiv) and THF (60 mL). The solution was cooled to −40° C. and phenylethynyllithium (1.0 M in THF, 35 mL, 35 mmol, 1.2 equiv) was added over 5-10 min via syringe. The mixture was allowed to warm to RT and stirred for a further 1 h. The mixture was then cooled to 0° C. quenched with saturated aqueous $NH_4Cl$ (100 mL), and extracted with EtOAc (100 mL). The organic layer was washed with saturated aqueous NaCl, dried using sodium sulfate, and filtered. The filtrate was concentrated via rotary evaporation, then the residue was triturated with hexanes and filtered. This yielded compound 4 (12.8 g) as an off-white solid that was used without further purification.

To a dry 250 mL flask equipped with magnetic stirbar was added 4-methoxy-1-naphthol (3.50 g, 20.1 mmol, 1.0 equiv), compound 4 (8.88 g, 20.1 mmol, 1.0 equiv), pyridinium p-toluenesulfonate (PPTS, 0.25 g, 1.0 mmol, 0.05 equiv), anhydrous 1,2-dichloroethane (40 mL), and, finally, trimethyl orthoformate (4.27 g, 40.2 mmol, 2.0 equiv). The mixture was heated at 85° C. under an $N_2$ atmosphere for 6 h. The reaction mixture was cooled to room temperature, volatile materials were removed via rotary evaporation, and the residue was subjected to silica gel chromatography (0-10% ethyl acetate in hexanes). The product containing fractions were triturated with a minimal amount of EtOAc and filtered. The solid was dried under high vacuum to afford compound 5 (9.0 g) as a white solid, which was employed in the next step without characterization.

To a 40 mL screw-cap, amber-colored vial was added compound 5 (250 mg, 0.42 mmol, 1.0 equiv), compound 6 (311 mg, 0.92 mmol, 2.2 equiv), [1,1'-bis(diphenylphosphino)ferrocene]-dichloropalladium (10.2 mg, 0.03 equiv), potassium carbonate (462 mg, 3.3 mmol, 8.0 equiv), and a magnetic stirbar. The vial was sealed and placed under an $N_2$ atmosphere with three vacuum/$N_2$ cycles. To this vial was then added a deoxygenated 5/1 mixture of dioxane/water (10 mL) via syringe. The stirred mixture was heated at 85° C. (heating block temperature) for 5 h (TLC indicated reaction completion). The mixture was partitioned between $CH_2Cl_2$ (30 mL) and water (30 mL), the organic layer was dried with $Na_2SO_4$ and filtered, then volatile materials were removed via rotary evaporation at 40° C. The residue was subjected to column chromatography ($CH_2Cl_2$) to afford compound NP24 (270 mg, 75%) as a pale-yellow solid. $^1H$ NMR (400 MHz, $CDCl_3$) δ 8.87-8.86 (m, 2H), 8.61-8.65 (m, 2H), 8.53-8.51 (m, 1H), 8.19-8.17 (m, 1H), 7.88-7.87 (m, 2H), 7.81-7.78 (m, 4H), 7.72-7.69 (m, 4H), 7.66-7.60 (m, 9H), 7.55-7.44 (m, 6H), 6.56 (s, 1H), 6.33 (s, 1H), 3.79 (s, 3H).

Example I-2

Base Resin Preparation Procedure 55 grams of Crystasense HP-5 (Croda) was dissolved in 90 mL of 2-(Dimethylamino)ethyl methacrylate. This solution was mixed with 50 g of benzyl acrylate, 650 g of Genomer 4247 (Rahn), 200 grams of Genomer 4259 using a mechanical overhead stirrer until a homogeneous mixture was achieved.

Example I-3

Procedure for Preparation of Base Resin Formulation Including a Photoswitchable Photoinitiator A stock solution of a photoswitchable photoinitiator was prepared by dissolving the photoswitchable photoinitiator (NP24), prepared generally as described in Example I-1, in 1:1 v/v mixture of N,N-dimethylacrylamide (DMAA, Rahn) and benzyl acrylate (Beantown chemical) in a 20 mL amber vial such that the final concentration was approximately 1.25 mg/mL of photoswitchable photoinitiator in solvent. 0.3 mL of this photoswitchable photoinitiator stock solution was added to 14.7 g of base resin described above to create a resin formulation containing 25 ppm of photoswitchable photoinitiator. At this point a polymerization coinitiator was added, for example N-methyldiethanolamine, at a desired concentration (typically 3% by weight). This resin formulation was speedmixed (DAC 2800-1000, Flacktek) at 3000 rpm for 1 min for a total of two times.

Example I-4

Preparation of Test Samples

Two test samples were prepared as set forth below: one that included a second light-activated photoinitiator and one that included no second light activated-photoinitiator.

In the case of the test sample that included a second photoinitiator, to 15 grams of a base resin (prepared generally as described in Example I-3 that includes a photoswitchable photoinitiator prepared generally as described in Example I-1 and a coinitiator) was added 0.045 grams of Omnirad 184 (IGM Resins) and the mixture was stirred at room temperature until homogeneous, then transferred to a 2.5 mL plastic cuvette (Einmal-Küvetten), centrifuged to remove bubbles at 4500 rpm for 5 minutes (5804R, Eppendorf) and then used for printing.

In the case of a test sample that did not include a second photoinitiator, a base resin formulation (prepared generally as described in Example I-3 that included a photoswitchable photoinitiator prepared generally as described in Example I-1 and coinitiator) was then used for printing after transfer to a 2.5 mL plastic cuvette (Einmal-Küvetten) and centrifugation to remove trapped air bubbles at 4500 rpm for 5 minutes (5804R, Eppendorf).

Effort was made to shield the two test samples from light until used for printing.

Example I-5

Example of Printing an Object in a Photohardenable Composition Including a Photohardenable Photoinitiator and a Photohardenable Resin Component with and without a

Second Light—Activated Photoinitiator

A cuvette including one of the two test samples described in Example I-4 was placed in a plastic holder on a motorized stage. Green laser light (532 nm CW diode laser, 18 W operating power) was used to illuminate a digital micromirror device (Texas Instruments) to form a pattern which was projected into the cuvette along the z axis to produce a pattern of approximately 1.6 $W/cm^2$ of green light. In the experiments discussed here, the pattern was designed to form an 8×8×8 millimeter solid cube. Violet light (408 nm CW diode laser, 50-365 mW operating power) was used to form a light sheet that passed through the cuvette orthogonally to the projected pattern to illuminate a single x-y plane of approximately 100 microns thickness, and at the far side reflected off a mirror and retraced this beam pass to make two passes through the resin (generally as described in International Patent Application No. PCT/US2022/052157, filed Dec. 7, 2022, of Quadratic 3D, Inc.), overall producing a 100 micron wide light sheet with an intensity of approximately 1 $W/cm^2$. Printing was performed at room temperature. The stage was advanced in increments of 14 microns at intervals of 60 ms, with the UV or violet light forming a light sheet and the green light pattern changing at each advancement corresponding to computer generated slices of a three-dimensional object. In regions where there was simultaneous or nearly simultaneous exposure to both wavelengths of light, the photohardenable composition hardened. In this manner, a three-dimensional solid object was formed without displacement (e.g., sinking or drifting) and without need for support structures or attachment to a build platform due to the high zero shear viscosity or yield stress of the non-Newtonian photohardenable composition.

The part was removed from the unhardened base resin formulation using a spatula, washed for 2 minutes by agitation in isopropyl alcohol, left to dry for 10 minutes, then further post cured in Form Cure (Formlabs), which emits 9.1 Watts of 396 nm centered irradiation, for 15 minutes to further harden the part.

The printing procedure was repeated for the other test sample.

For each of the two test samples (one with and one without Omnirad 184 as a second photoinitiator), similar printed parts were produced using the same printer settings.

Cubes produced in this process after drying for both test samples and before irradiation with 396 nm light had a Shore A Durometer hardness that measure to be around 35. (The ASTM D2240) Shore Type A scale is used for softer materials.)

Following the post-cure at the third wavelength (396 nm), there is a large difference in the post-cured properties of the parts. The resin without second photoinitiator had a Shore D Durometer hardness of 60 while the formulation containing the second photoinitiator had an improved Shore D Durometer hardness of 85. (The ASTM D2240 Shore D scale is used for harder materials.)

Example II

Example II-1

Preparation of Photoswitchable Photoinitiator Represented by the Formula/Structure Designated as AE32 in the Reaction Scheme Below Preparation of AE32:

A photoswitchable photoinitiator represented by the formula/structure identified in the below reaction scheme as Compound No. AE32, was prepared as set forth in this Example II-1

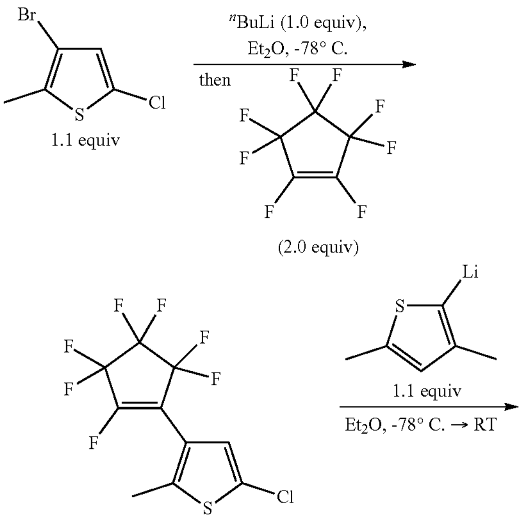

1

-continued

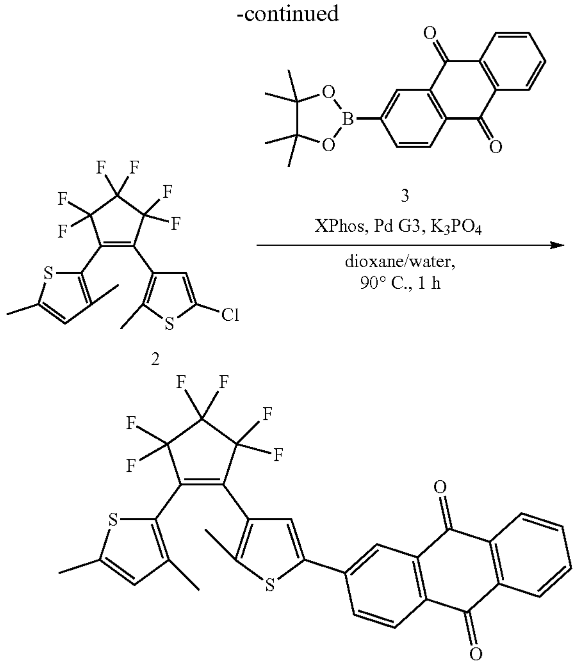

3

2

AE32

A 100 mL flame-dried Schlenk flask was charged with 3-bromo-5-chloro-2-methylthiophene (2.33 g, 11.0 mmol, 1.1 equiv), dry diethyl ether (30 mL), and a magnetic stirbar. The stirred solution was cooled to −78° C. with a dry ice/acetone bath, then n-BuLi (2.5 M in hexanes, 4.0 mL, 10.0 mmol, 1.0 equiv) was added dropwise over 3-5 min via syringe. The mixture was stirred for 30 min at the −78° C., then perfluorocyclopentene (4.2 g, 20 mmol, 2.0 equiv) was added rapidly via syringe. After a further 3-5 min at −78° C., the cold bath was removed, and the mixture was allowed to warm to room temperature. After 1 h at room temperature, the mixture was quenched with saturated aqueous $NH_4Cl$ (30 mL). The layers were separated, and the organic layer was washed with saturated aqueous NaCl (30 mL), dried with $Na_2SO_4$, filtered, and solvents were removed from the filtrate via rotary evaporation. The residue was purified by column chromatography (100% hexanes), affording compound 1 (1.62 g, 50%) as a colorless liquid. This liquid was directly employed in the next step without characterization.

A 25 mL flame-dried Schlenk flask was charged with 2-bromo-3,5-dimethylthiophene (540 mg, 2.83 mmol, 1.2 equiv), dry diethyl ether (10 mL), and a magnetic stirbar. The stirred solution was cooled to −78° C. with a dry ice/acetone bath, then n-BuLi (2.5 M in hexanes, 1.04 mL, 2.59 mmol, 1.1 equiv) was added dropwise over ~1 min via syringe. The mixture was placed on an ice/water bath for 15 min, then it was placed back on the −78° C. bath for ~5 min. Compound 1 (765 mg, 2.36 mmol, 1.0 equiv) was added dropwise over ~1 min via syringe. After a further 3-5 min at −78° C., the cold bath was removed, and the mixture was allowed to warm to room temperature. After 1 h at room temperature, the mixture was quenched with saturated aqueous $NH_4Cl$ (20 mL) and extracted with EtOAc (20 mL). The organic layer was washed with saturated aqueous NaCl (30 mL), dried with $Na_2SO_4$, filtered, and solvents were removed from the filtrate via rotary evaporation. The residue was purified by column chromatography (100% hexanes), affording compound 2 (0.57 g, 58%) as a colorless crystalline solid, which employed in the next step without characterization.

To a 20 mL amber-colored vial was added compound 2 (550 mg, 1.32 mmol, 1.00 equiv), compound 3 (463 mg, 1.39 mmol, 1.05 equiv), XPhos Pd G3 (34 mg, 0.03 equiv), anhydrous potassium phosphate (1.40 g, 6.60 mmol, 5.0 equiv), and a magnetic stirbar. The vial was sealed with a Teflon-lined cap and placed under an $N_2$ atmosphere with three vacuum/$N_2$ cycles. To this vial was then added a deoxygenated 5:1 mixture (v/v) of dioxane/water (6 mL) via syringe. The vial was sealed with electrical tape and placed on a heating block set to 90° C., then the mixture was stirred for 1 h. The mixture was partitioned between $CH_2Cl_2$ (20 mL) and water (20 mL), the organic layer was dried with $Na_2SO_4$ and filtered, then volatile materials were removed via rotary evaporation at 40° C. The residue was subjected to column chromatography (40-80% $CH_2Cl_2$ in hexanes) to afford compound AE32 (587 mg, 76%) as a yellow solid. $^1H$ NMR (400 MHZ, $C_6D_6$) δ 8.46 (d, J=2.0 Hz, 1H), 8.28-8.20 (m, 2H), 8.19 (d, J=8.2 Hz, 1H), 7.34 (s, 1H), 7.31 (dd, J=8.2, 2.0 Hz, 1H), 7.11-7.06 (m, 2H), 5.97 (s, 1H), 1.89 (s, 3H), 1.75 (s, 3H), 1.56 (s, 3H).

Example II-2

Base Resin Preparation Procedure 25 milliliters of N,N-Dimethylacrylamide is mixed with 70 milliliters of isobornyl acrylate and 5.5 grams of Crystasense HP5 (Croda). This solution is stirred at 80 degrees Celsius to fully dissolve and homogenize the components.

A second solution was prepared by mixing 650 grams of Genomer 4247 (Rahn) and 200 grams of Genomer 4259 (Rahn) at 60 degrees Celsius in a Flaktek speedmixer bucket. To this warm solution is added the solution containing the Crystasense HP5, and the resulting mixture is speedmixed at 1000 RPM for 1 minute (DAC 2800-1000, Flacktek). Finally, 60 grams of N-Methyldiethanolamine is added to the speedmixer bucket, and the entire mixture is speedmixed one more time for 1 minute at 1000 RPM.

Example II-3

Procedure for Preparation of Base Resin Formulation Including a Photoswitchable Photoinitiator A stock solution of a photoswitchable photoinitiator was prepared by dissolving the photoswitchable photoinitiator prepared generally as described in Example II-1) in 25 mL of 1:1 v/v mixture of N,N-dimethylacrylamide (DMAA, Rahn) and benzyl acrylate (Beantown chemical) in a 40 mL amber vial such that the final concentration was approximately 0.75 mg/mL of photoswitchable photoinitiator in solvent. 0.3 mL of this photoswitchable photoinitiator stock solution was added to 14.7 grams of base resin described above to create a resin formulation containing 15 ppm of photoswitchable photoinitiator. This resin formulation was speedmixed (DAC 2800-1000, Flacktek) at 3000 rpm for 1 min.

Example II-4

Preparation of Test Samples

Two test samples were prepared as set forth below: one that included a second photoinitiator and one that included no second photoinitiator.

To prepare the test sample including the second photoinitiator, to 1 kilogram of resin prepared generally as set forth in Example II-3 was added 0.6% by weight of 1-Hydroxycyclohexyl-phenyl ketone (Omnirad 184, IGM Resins, CAS NO. 947-19-3) and the mixture was stirred until all solid dissolved. It was centrifuged at 4500 rpm for 5 minutes (5804R, Eppendorf) to remove bubbles and poured into custom quartz cuvettes of internal dimension 2×2×4 cm for printing.

In the case of the test sample that did not include a second photoinitiator, 500 grams of base resin formulation (prepared generally as described in Example II-3 was centrifuged at 4500 rpm for 5 minutes (5804R, Eppendorf) to remove bubbles and poured into custom quartz cuvettes of internal dimension 2×2×4 cm for printing.

Example II-5

Example of Printing an Object in a Photohardenable Composition Including a Photohardenable Photoinitiator and a Photohardenable Resin Component with and without a Second Light-Activated Photoinitiator Two cuvettes, each including one of the two samples described in Example II-4, were prepared for printing: one including a second photoinitiator and the other not including a second photoinitator.

One cuvette including the sample described in Example II-4 including a second photoinitator and another cuvette including the sample described in Example II-4 not including a second photoinitiator were used for printing 7×7×7 mm cube as generally described in this Example II-5.

These cuvettes were separately loaded into the following printing setup:

Violet light (408 nm mW diode laser, 365 mW maximum operating power) was illuminated off a scanning galvanometer to generate a light sheet of approximately 130 micron thickness, and was reflected off a mirror and retraced a similar optical beam path to achieve a combined double-pass light sheet (generally as described in International Patent Application No. PCT/US2022/052157, filed Dec. 7, 2022, of Quadratic 3D, Inc.) with irradiance of 0.50 W/cm$^2$ of violet light. This light was intersected orthogonally by projected green light green irradiance (532 nm laser, 18 Watt maximum operating power continuous wave diode laser) of 1.0 W/cm$^2$ projected orthogonally to the light sheet using a Texas Instruments DMD to pattern the projected green light spatially.

A 7×7×7 mm cube was printed in each cuvette using the following print settings:

40 degrees Celsius, 28 micron stage movement intervals, 150 milliseconds exposure per slice. In each case a cube was successfully printed, was then washed for 1 minute by stirring in isopropyl alcohol, and allowed to dry for 10 minutes, then post cured under nitrogen in a form cure for 10 minutes (9.1 Watts of 396 nm centered LED irradiation).

For these cubes, hardness was tested using a Shore D hardness tester to compare conversion of the resin to polymer. In the cube printed in resin without any secondary photoinitiator, Shore D hardness after this postcuring protocol was 65D, while in the resin containing the secondary photoinitiator, the printed cube had a shore hardness of 87D.

The inclusion of the second photoinitiator activatable at a wavelength shorter than 405 nm appeared to be substantially inactive at the two printing wavelengths and resulted in more complete postcuring without substantially affecting print settings.

When used as a characteristic of a portion of a container or build chamber, "optically transparent" refers to having high optical transmission to the wavelength of light being used, and "optically flat" refers to being non-distorting (e.g., optical wavefronts entering the portion of the container or build chamber remain largely unaffected).

As used herein, the singular forms "a", "an" and "the" include plural unless the context clearly dictates otherwise. Thus, for example, reference to an emissive material includes reference to one or more of such materials.

Applicant specifically incorporates the entire contents of all cited references in this disclosure. Further, when an amount, concentration, or other value or parameter is given as either a range, preferred range, or a list of upper preferable values and lower preferable values, this is to be understood as specifically disclosing and including all ranges formed from any pair of any upper range limit or preferred value and any lower range limit or preferred value, regardless of whether ranges are separately disclosed, as well as the upper and lower value of each range. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A photohardenable composition comprising a photohardenable resin component, a first photoinitiator comprising a photoswitchable photoinitiator that is activatable by exposure to light at a first wavelength and light at a second wavelength to induce a crosslinking or polymerization reaction in the photohardenable composition, and a second photoinitiator comprising a free-radical photoinitiator that is activatable by exposure to light at a third wavelength, wherein the first, second, and third wavelengths are not the same, and the third wavelength is shorter than the first wavelength and the second wavelength.

2. The photohardenable composition of claim 1 wherein the second photoinitiator comprises a Norrish Type II free-radical photoinitiator.

3. The photohardenable composition of claim 1 further comprising a coinitiator.

4. The photohardenable composition of claim 1 wherein the second photoinitiator is not activatable by the first wavelength or the second wavelength.

5. The photohardenable composition of claim 1 wherein the first photoinitiator is included in the photohardenable composition in an amount in a range from about 0.0001 to about 0.5 weight percent.

6. The photohardenable composition of claim 1 wherein the first wavelength is in a range from about 300 nm to about 550 nm.

7. The photohardenable composition of claim 1 wherein the second wavelength is in a range from about 450 nm to about 700 nm.

8. The photohardenable composition of claim 1 wherein the third wavelength is in a range from about 240 nm to about 455 nm.

9. The photohardenable composition of claim 1 wherein the second photoinitiator comprises 1-hydroxycyclohexyl phenyl ketone.

10. The photohardenable composition of claim 1 wherein the photohardenable composition exhibits non-Newtonian rheological behavior.

11. A photohardenable composition comprising a photohardenable resin component, a first photoinitiator comprising a photoswitchable photoinitiator that is activatable by exposure to light at a first wavelength and light at a second wavelength to alter at least one chemical or physical property of the photohardenable composition, a coinitiator, and a second photoinitiator comprising a Norrish Type I free-radical photoinitiator that is activatable by exposure to light at a third wavelength, wherein the first, second, and third wavelengths are not the same, and the third wavelength is shorter than the first wavelength and the second wavelength.

12. The photohardenable composition of claim 11 wherein the first photoinitiator is included in the photohardenable composition in an amount in a range from about 0.0001 to about 0.009 weight percent.

13. The photohardenable composition of claim 11 wherein the second photoinitiator is included in the photohardenable composition in an amount in a range from about 0.0001 to about 0.5 weight percent.

14. The photohardenable composition of claim 12 wherein the second photoinitiator is included in the photohardenable composition in an amount in a range from about 0.0001 to about 0.5 weight percent.

15. The photohardenable composition of claim 11 wherein the coinitiator comprises an iodonium salt in combination with a tertiary amine.

16. The photohardenable composition of claim 11 wherein the first wavelength is in a range from about 375 nm to about 455 nm.

17. The photohardenable composition of claim 11 wherein the second wavelength is in a range from about 450 nm to about 700 nm.

18. The photohardenable composition of claim 11 wherein, the third wavelength is in a range from about 240 nm to about 455 nm.

19. The photohardenable composition of claim 11 wherein the photohardenable composition exhibits non-Newtonian rheological behavior.

20. The photohardenable composition of claim 11 wherein the second photoinitiator is not activatable by the first wavelength or the second wavelength.

21. The photohardenable composition of claim 3 wherein the coinitiator comprises an iodonium salt in combination with a tertiary amine.

22. The photohardenable composition of claim 1 wherein the second photoinitiator comprises a Norrish Type I free-radical photoinitiator.

23. A photohardenable composition for use in printing one or more three dimensional objects in a volume of the photohardenable composition, the photohardenable composition comprising a photohardenable resin component, a first photoinitiator comprising a photoswitchable photoinitiator, one or more coinitiators, and a second photoinitiator comprising a Norrish Type I free-radical photoinitiator, wherein the first photoinitiator is activatable upon exposure to an intersection of a first wavelength and second wavelength to induce a polymerization or cross-linking reaction in the photohardenable composition, wherein the second photoinitiator is activatable by exposure to light at a third wavelength, wherein the first, second, and third wavelengths are not the same, and the third wavelength is shorter than the first wavelength and the second wavelength, and wherein the second photoinitiator shows no or minimal absorption of the first wavelength and second wavelengths for avoiding reactions in the photohardenable composition in the absence of irradiation with the third wavelength.

24. The photohardenable composition of claim 23 wherein the photohardenable composition includes:

the first photoinitiator in an amount from about 0.0001 to about 0.1 parts per hundred, the one or more coinitiators in an amount from about 0.001 to about 7.5 parts per hundred, the second photoinitiator in an amount from about 0.0001 to about 10 parts per hundred, and a balance of the photohardenable composition comprising the photohardenable resin component, wherein the balance takes into account amounts of any one or more other optional additives included in the photohardenable composition.

25. The photohardenable composition of claim 23 wherein the photohardenable composition exhibits non-Newtonian rheological behavior.

* * * * *